US011069830B1

(12) United States Patent
Pawlak et al.

(10) Patent No.: US 11,069,830 B1
(45) Date of Patent: Jul. 20, 2021

(54) QUANTUM-CONFINED STARK EFFECT (QCSE) MODULATOR AND PHOTONICS STRUCTURE INCORPORATING THE QCSE MODULATOR

(71) Applicants: GLOBALFOUNDRIES U.S. Inc., Malta, NY (US); IMEC vzw, Leuven (BE)

(72) Inventors: Bartlomiej J. Pawlak, Leuven (BE); Clement J. E. Porret, Kessel-Lo (BE); Srinivasan Ashwyn Srinivasan, Heverlee (BE)

(73) Assignees: GLOBALFOUNDRIES U.S. Inc., Malta, NY (US); IMEC vzw, Leuven (BE)

( * ) Notice: Subject to any disclaimer, the term of this patent is extended or adjusted under 35 U.S.C. 154(b) by 0 days.

(21) Appl. No.: 16/819,416

(22) Filed: Mar. 16, 2020

(51) Int. Cl.
*H01L 31/028* (2006.01)
*H01L 31/105* (2006.01)
(Continued)

(52) U.S. Cl.
CPC .......... *H01L 33/06* (2013.01); *H01L 33/0016* (2013.01); *H01L 33/14* (2013.01); *H01L 33/26* (2013.01)

(58) Field of Classification Search
CPC ......... H01L 33/06; H01L 33/26; H01L 33/34; H01L 33/14; H01L 33/0016; H01L 33/38; H01L 33/36; H01L 33/52; H01L 31/035236; H01L 31/035209; H01L 31/1804; H01S 5/18302; H01S 5/18325;
(Continued)

(56) References Cited

U.S. PATENT DOCUMENTS 5,953,479 A 9/1999 Zhou et al.
7,515,776 B1 * 4/2009 Miller .................... B82Y 20/00
385/2
(Continued)

OTHER PUBLICATIONS

Kuo et al., "Strong Quantum-Confined Stark Effect in Germanium Quantum-Well Structures on Silicon," Nature Publishing Group, vol. 437, No. 27, 2005, pp. 1334-1336.
(Continued)

*Primary Examiner* — Natalia A Gondarenko
(74) *Attorney, Agent, or Firm* — Gibb & Riley, LLC; Francois Pagette

(57) ABSTRACT

Disclosed is a quantum-confined Stark effect (QCSE) modulator. In the modulator, a first doped semiconductor region has a first type conductivity, is at the bottom of a trench in a dielectric layer and is immediately adjacent to a semiconductor layer. An MQW region is in the trench on the first doped semiconductor region and at least upper segments of sidewalls of the MQW region are angled away from adjacent sidewalls of the trench such that there are spaces between the MQW region and the dielectric layer. Dielectric spacers fill the spaces. A second doped semiconductor region has a second type conductivity, is on top of the MQW region and optionally extends laterally onto the tops of the dielectric spacers. The spacers prevent shorting of the doped semiconductor regions. Also disclosed are embodiments of a photonics structure including the modulator and of methods for forming the modulator and the photonics structure.

20 Claims, 15 Drawing Sheets

(51) Int. Cl.
*G02F 1/225* (2006.01)
*G02F 1/015* (2006.01)
*G02F 1/025* (2006.01)
*G02B 6/13* (2006.01)
*G02B 6/42* (2006.01)
*H01L 33/06* (2010.01)
*H01L 33/26* (2010.01)
*H01L 33/14* (2010.01)
*H01L 33/00* (2010.01)

(58) Field of Classification Search
CPC .... H01S 5/2018; H01S 5/2031; H01S 5/2054; H01S 5/2205; H01S 5/2211; H01S 5/2218; H01S 5/2226; H01S 5/2228; H01S 5/223; H01S 5/2231; H01S 5/2232; H01S 5/2234; H01S 5/2235; H01S 5/2237; H01S 5/227; H01S 5/2275; H01S 5/30; H01S 5/3004; H01S 5/3009; H01S 5/3031; H01S 5/3216; H01S 5/341; G01N 22/005

USPC .......... 257/13, 14, 19, 21, 96; 385/2, 3, 131, 385/141

See application file for complete search history.

(56) References Cited

U.S. PATENT DOCUMENTS

| | | | |
|---|---|---|---|
| 8,401,345 B2* | 3/2013 | Zheng | G02B 6/1228 385/2 |
| 9,245,951 B1 | 1/2016 | Camillo-Castillo et al. | |
| 9,583,569 B2 | 2/2017 | Camillo-Castillo et al. | |
| 2020/0313026 A1* | 10/2020 | Szelag | H01L 31/1804 |

OTHER PUBLICATIONS

Ren et al., "Selective Epitaxial Growth of Ge/Si0.15Ge0.85 Quantum Wells on Si Substrate using Reduced Pressure Chemical Vapor Deposition," American Institute of Physics, Applied Physics Letters, vol. 98, 151108, 2011, pp. 1-4.

Rouifed et al., "Advances Toward Ge/SiGe Quantum-Well Waveguide Modulators at 1.3um," IEEE Journal of Selected Topics in Quantum Electronics, vol. 20, Issue 4, 2014.

\* cited by examiner

QUANTUM-CONFINED STARK EFFECT (QCSE) MODULATOR AND PHOTONICS STRUCTURE INCORPORATING THE QCSE MODULATOR

BACKGROUND

Field of the Invention

The present invention relates to modulators and, more particularly, to a robust quantum-confined Stark effect (QCSE) modulator, to an integrated photonics structure that incorporates the QCSE modulator and methods of forming the structures.

Description of Related Art

Quantum-confined Stark effect (QCSE) modulators are devices employed in silicon (Si) photonics for optical modulation, for example, in the near-infrared spectral range. A QCSE modulator can include a PIN semiconductor structure. The PIN semiconductor structure can include: a first doped semiconductor region with a first type conductivity (e.g., a P-type silicon germanium (SiGe) region) on the top surface of a semiconductor layer having the first type conductivity (e.g., a P-type silicon (Si) layer); an undoped semiconductor region (i.e., an intrinsic semiconductor region) and, more particularly, a multi-quantum well (MQW) region on the first doped semiconductor region; and a second doped semiconductor region with a second type conductivity (e.g., an N-type SiGe region) on the MQW region. The MQW region can include a stack of intrinsic semiconductor layers including bottom and top quantum barrier layers and alternating quantum well and quantum barrier layers between the bottom and top quantum barrier layers. Such a QCSE modulator can be inserted in-line between two waveguides in a photonics structure. In operation, one or both of the doped semiconductor regions can be selectively biased in order to selectively change the electrical field across the MQW region and, in turn, to fine-tune the absorption coefficient of the QCSE modulator. By fine-tuning the absorption coefficient, the amplitude of light intensity passing from one waveguide to the next can be selectively modulated (i.e., adjusted, changed, etc.). Unfortunately, the currently used techniques for forming the PIN structure (discussed in greater detail below) rely on multiple epitaxial growth process steps that may result in corner defects, which can lead to a non-uniform electric field and, potentially, shorts between the doped semiconductor regions.

SUMMARY

In view of the foregoing, disclosed herein are embodiments of a robust quantum-confined Stark effect (QCSE) modulator. The QCSE modulator can include a first doped semiconductor region, which has a first type conductivity (e.g., P-type conductivity), which is at the bottom of a trench in a dielectric layer, and which is immediately adjacent to a semiconductor layer that also has the first type conductivity. The QCSE modulator can further include a multi-quantum well (MQW) region in the trench on the first doped semiconductor region. At least upper segments of sidewalls of the MQW region can be angled away from adjacent sidewalls of the trench such that there are spaces between the MQW region and the dielectric layer. Dielectric spacers can fill those spaces. The QCSE modulator can further include a second doped semiconductor region, which has a second type conductivity (e.g., N-type conductivity), which is on the top of the MQW region and which optionally further extends laterally onto the tops of the dielectric spacers. The dielectric spacers can prevent shorting of the doped semiconductor regions and can further minimize the occurrence of a non-uniform electric field across the MQW region during biasing of the doped semiconductor region(s). Also disclosed herein are embodiments of a photonics structure, which incorporates such a QCSE modulator at an interface between a pair of waveguides to enable modulation of a light signal passing between the waveguides, and embodiments of methods for forming the QCSE modulator and the photonics structure.

More particularly, disclosed herein are embodiments of a robust quantum-confined Stark effect (QCSE) modulator. The QCSE modulator can include a first doped semiconductor region, which has a first type conductivity (e.g., P-type conductivity). This first doped semiconductor region can be at the bottom of a trench, which extends through a dielectric layer to a semiconductor layer that also has the first type conductivity. The QCSE modulator can further include a multi-quantum well (MQW) region, which is in the trench on the first doped semiconductor region. This MQW region can include a stack of intrinsic epitaxial semiconductor layers including, for example: a bottom quantum barrier layer; alternating quantum well and quantum barrier layers with a lowermost quantum well layer being above and immediately adjacent to the bottom quantum barrier layer; and a top quantum barrier layer above and immediately adjacent to an uppermost quantum well layer. It should be noted that the trench can have first sidewalls and the multi-quantum well region can have second sidewalls that are adjacent to the first sidewalls, respectively. However, at least upper segments of the second sidewalls are angled away from the first sidewalls such that there are spaces between the first sidewalls and the second sidewalls (i.e., between the MQW region and the dielectric layer). Dielectric spacers can fill these spaces. Finally, the QCSE modulator can further include a second doped semiconductor region, which has a second type conductivity that is different from the first type conductivity (e.g., which has N-type conductivity) and which is on the top of the MQW region and optionally extends laterally onto the dielectric spacers.

Also, disclosed herein are embodiments of a semiconductor structure and, particularly, an integrated photonics structure that incorporates the above-described QCSE modulator at the interface between a pair of waveguides in order modulate a light signal that passes between the waveguides. More specifically, also disclosed herein are embodiments of a photonics structure that includes a semiconductor layer having a first type conductivity (e.g., P-type conductivity). The photonics structure can further include a dielectric layer on the top surface of the semiconductor layer. A trench can extend through the dielectric layer to the top surface of the semiconductor layer. The photonics structure can further include a QCSE modulator. The QCSE modulator can include a first doped semiconductor region, which has a first type conductivity (e.g., P-type conductivity). This first doped semiconductor region can be at the bottom of the trench. The QCSE modulator can further include a multi-quantum well (MQW) region, which is in the trench on the first doped semiconductor region. This MQW region can include a stack of intrinsic epitaxial semiconductor layers including, for example: a bottom quantum barrier layer; alternating quantum well and quantum barrier layers with a lowermost quantum well layer being above and immediately adjacent to the bottom quantum barrier layer; and a top quantum barrier layer above and immediately adjacent to an uppermost quantum well layer. It should be noted that the trench can have first sidewalls and the multi-quantum well region can have second sidewalls that are adjacent to the first sidewalls, respectively. However, at least upper segments of the second sidewalls are angled away from the first sidewalls such that there are spaces between the first sidewalls and the second sidewalls (i.e., between the MQW region and the dielectric layer). Dielectric spacers can fill these spaces. Finally, the QCSE modulator can further include a second doped semiconductor region, which has a second type conductivity that is different from the first type conductivity (e.g., which has N-type conductivity) and which is on the top of the MQW region and optionally extends laterally onto the dielectric spacers. The photonics structure can further include waveguides at opposing ends of the QCSE modulator. That is, the QCSE modulator is at an interface between the waveguides.

Also disclosed herein method embodiments for forming the above-described QCSE modulator and the photonics structure. Specifically, the method embodiments can include providing a semiconductor layer, which has a first type conductivity (e.g., P-type conductivity). A dielectric layer can be formed on the semiconductor layer. A trench can be formed in the dielectric layer such that the trench has first sidewalls and a bottom and further such that the semiconductor layer is exposed at the bottom of the trench.

The method embodiments can further include forming a QCSE modulator such that the QCSE modulator includes: a first doped semiconductor region in the trench on the semiconductor layer, wherein the first doped semiconductor region has the first type conductivity; a multi-quantum well (MQW) region in the trench on the first doped semiconductor region, wherein the MQW region has second sidewalls adjacent to the first sidewalls, respectively, and wherein at least upper segments of the second sidewalls are angled away from the first sidewalls; dielectric spacers filling spaces between the second sidewalls and the first sidewalls; and a second doped semiconductor region on a top surface of the multi-quantum well region, wherein the second doped semiconductor region has a second type conductivity that is different from the first type conductivity (e.g., N-type conductivity).

Specifically, the steps employed for forming the QCSE modulator can include depositing a first in-situ doped semiconductor layer for the first doped semiconductor region in the trench on the semiconductor layer (e.g., using an epitaxial growth process). A stack of intrinsic semiconductor layers for the multi-quantum well region can be deposited onto the first doped semiconductor region (e.g., also using epitaxial growth processes). This stack can include: a bottom quantum barrier layer; alternating quantum well and quantum barrier layers with a lowermost quantum well layer being above and immediately adjacent to the bottom quantum barrier layer; and a top quantum barrier layer above and immediately adjacent to an uppermost quantum well layer. It should be noted that epitaxially growing the layers in the stack results in at least upper segments of the second sidewalls of the MQW region being angled away from the first sidewalls of trench because the epitaxial growth processes are selective to the semiconductor material below over the dielectric material of the trench sidewalls. As a result, in this partially completed structure there are empty spaces between the first sidewalls of the trench (i.e., between surfaces of the dielectric layer) and at least the upper segments of the second sidewalls of the MQW region. To prevent these spaces from being filled with semiconductor material of a subsequently formed second doped semiconductor region, a dielectric spacer layer is deposited so as to fill the spaces and a planarization process (e.g., a chemical mechanical polishing process) is performed in order to expose the top quantum barrier layer, thereby forming the dielectric spacers in the spaces. After the dielectric spacers are formed, a second in-situ doped semiconductor layer for the second doped semiconductor region can be deposited onto (e.g., epitaxially grown on) the top quantum barrier layer and optionally extending laterally onto the dielectric spacers.

The method embodiments can further include forming waveguides at opposing ends of the QCSE modulator such that the QCSE modulator is located an interface between the waveguides.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
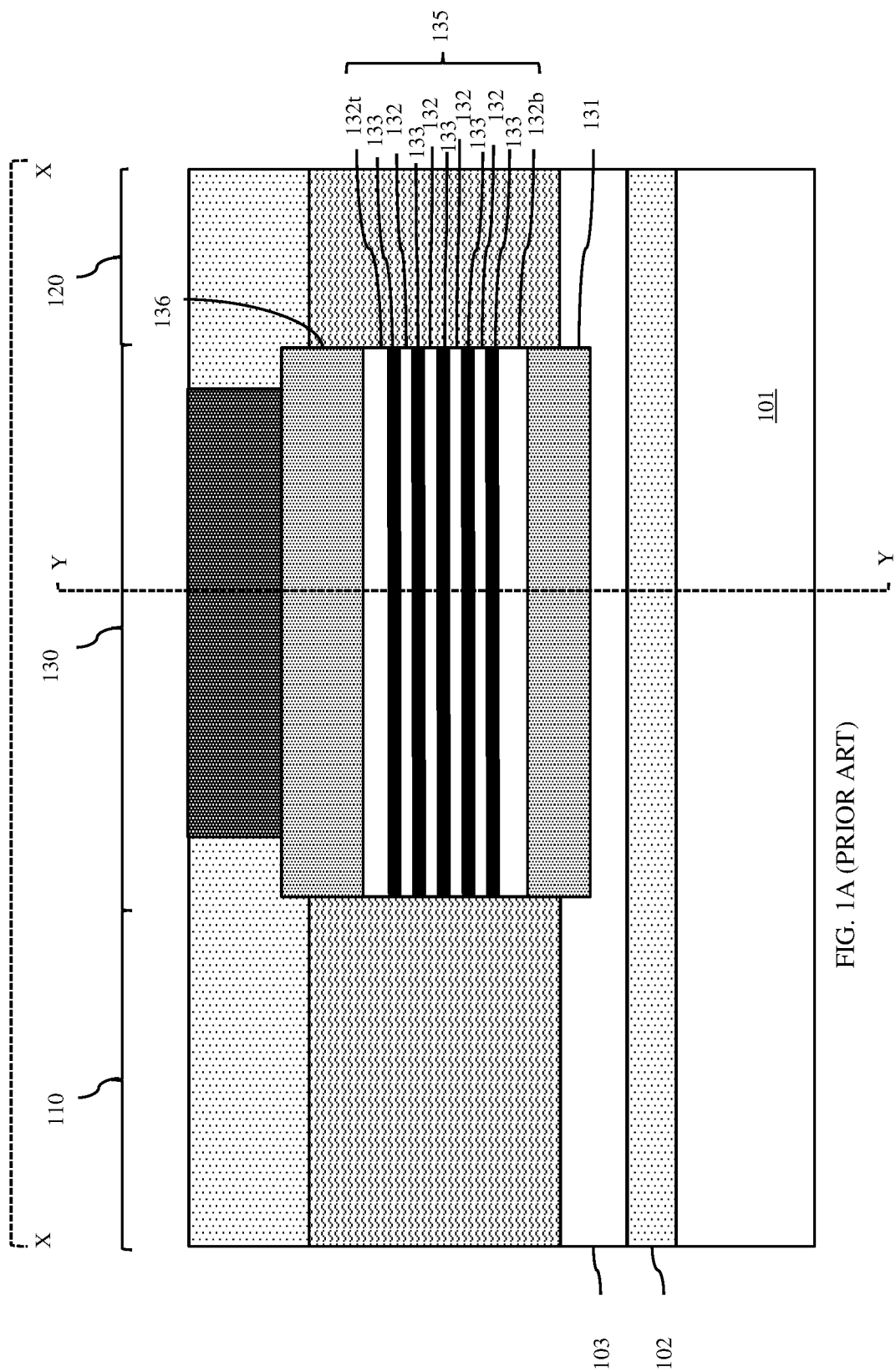
FIGS. 1A and 1B are cross-section drawings illustrating a prior art photonics structure that includes a quantum-confined Stark effect (QCSE) modulator between a pair of waveguides.

As mentioned above, Quantum-confined Stark effect (QCSE) modulators are devices employed in silicon (Si) photonics for optical modulation, for example, in the near-infrared spectral range. Referring to FIG. 1A, a QCSE modulator 130 can include a PIN semiconductor structure. The PIN semiconductor structure can include: a first doped semiconductor region 131 with a first type conductivity (e.g., a P-type silicon germanium (SiGe) region) on the top surface of a semiconductor layer 103 having the first type conductivity (e.g., a P-type silicon (Si) layer); an undoped semiconductor region (i.e., an intrinsic semiconductor region) and, more particularly, a multi-quantum well (MQW) region 135 on the first doped semiconductor region 131; and a second doped semiconductor region 136 with a second type conductivity (e.g., an N-type SiGe region) on the MQW region 135. The semiconductor layer 103 can be on a buried insulator layer 102 (e.g., a buried silicon dioxide ($SiO_2$) layer) on a semiconductor substrate 101 (e.g., a Si substrate). The MQW region 135 can include a stack of intrinsic semiconductor layers including a bottom quantum barrier layer 132*b*, a top quantum barrier layer 132*t* and alternating quantum well 133 and quantum barrier layers 132 between the bottom and top quantum barrier layers 132*b* and 132*t*. The intrinsic semiconductor layers can all be SiGe layers, where the quantum barrier layers have a higher percentage of Si and a lower percentage of Ge than the quantum well layers. Alternatively, the intrinsic semiconductor layers can include essentially pure Si quantum barrier layers and either SiGe or pure Ge quantum well layers. Alternatively, the intrinsic semiconductor layers can include SiGe quantum barrier layers and essentially pure Ge quantum well layers. Such a QCSE modulator can be inserted at an interface between two waveguides (i.e., a first waveguide 110 and second waveguide 120). In operation, one or both of the doped semiconductor regions 131, 136 can be selectively biased in order to selectively change the electrical field across the MQW region 135 and, in turn, to fine-tune the absorption coefficient of the QCSE modulator 130. By fine-tuning the absorption coefficient, the amplitude of light intensity passing from one waveguide to the next (e.g., from the waveguide 110 to the second waveguide 120) can be selectively modulated (i.e., adjusted, changed, etc.).

Figure 1B:
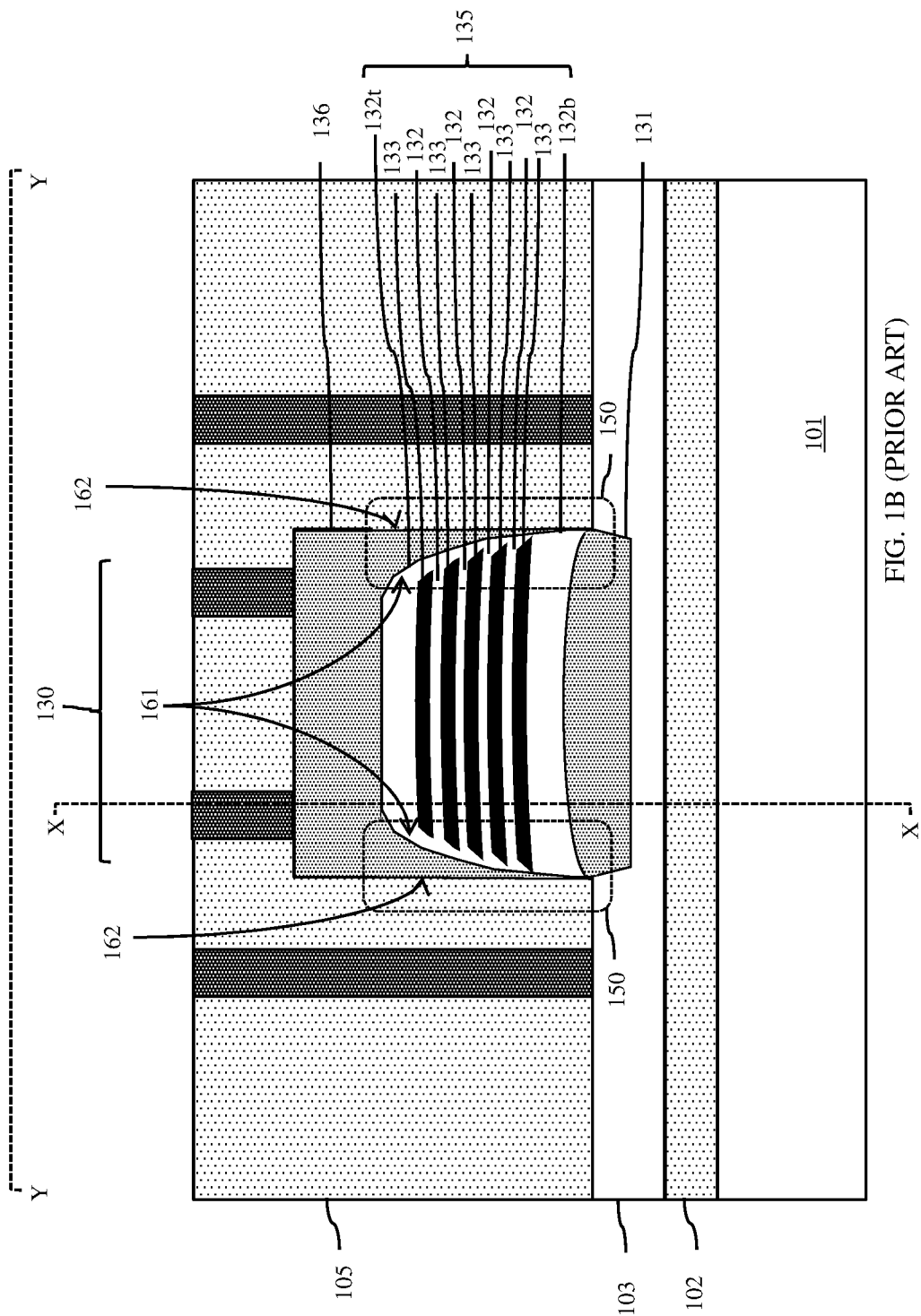

Unfortunately, the currently used techniques for forming a PIN structure, as described above, rely on multiple deposition process steps and, particularly, multiple epitaxial growth process steps that may result in corner defects 150 (as shown in FIG. 1B), which can lead to a non-uniform electric field and, potentially, shorts between the doped semiconductor regions. Specifically, currently used techniques for forming a PIN structure for a QCSE modulator include forming a dielectric layer 105 (e.g., a SiO₂ layer) on the top surface of the semiconductor layer 103 (e.g., P-type Si layer). A trench is formed in the dielectric layer 105 and multiple epitaxial semiconductor growth process steps are performed in order to form various layers of the PIN structure within the trench. However, epitaxial semiconductor growth can be selective to the semiconductor material at the bottom of the trench over the dielectric material at the sides of the trench. This can result in at least upper segments of the MQW region sidewalls 161 being angled away and physically separated from the trench sidewalls 162 (as opposed to being flush with and immediately adjacent to the trench sidewalls 162). If this occurs, top and side surfaces of the MQW region 135 may be exposed during epitaxial growth of the N-type SiGe layer for the second doped semiconductor region 136 and, thus, that second doped semiconductor region 136 fills the spaces between the MQW region sidewalls 161 and the adjacent trench sidewalls 162. As a result, the outer edge portions of the MQW region 135 may have fewer quantum wells between the doped semiconductor regions 131 and 136 and biasing the doped semiconductor regions 131 and 136 may result in a non-uniform electric field (i.e., variations in the electric field at the outer edge portions as compared to the center portion of the MQW region) and, thereby non-uniform light signal modulation. Worst case, the doped semiconductor regions may be shorted together such that a current path around the MQW region 135 is created, bypassing the MQW region 135 and minimizing any change in the electric field across the MQW region 135.

In view of the foregoing, disclosed herein are embodiments of a robust quantum-confined Stark effect (QCSE) modulator. The QCSE modulator can include a first doped semiconductor region, which has a first type conductivity (e.g., P-type conductivity), which is at the bottom of a trench in a dielectric layer, and which is immediately adjacent to a semiconductor layer that also has the first type conductivity. The QCSE modulator can further include a multi-quantum well (MQW) region in the trench on the first doped semiconductor region. At least upper segments of sidewalls of the MQW region can be angled away from adjacent sidewalls of the trench such that there are spaces between the MQW region and the dielectric layer. Dielectric spacers can fill those spaces. The QCSE modulator can further include a second doped semiconductor region, which has a second type conductivity (e.g., N-type conductivity), which is on the top of the MQW region and which optionally further extends laterally onto the tops of the dielectric spacers. The dielectric spacers can prevent shorting of the doped semiconductor regions and can further minimize the occurrence of a non-uniform electric field across the MQW region during biasing of the doped semiconductor region(s). Also disclosed herein are embodiments of a semiconductor structure and, more particularly, an integrated photonics structure, which incorporates such a QCSE modulator at an interface between a pair of waveguides to enable modulation of a light signal passing between the waveguides, and embodiments of methods for forming the QCSE modulator and the photonics structure.

More particularly, referring to FIGS. 2A-2B and 3A-3B, disclosed herein are embodiments of a robust quantum-confined Stark effect (QCSE) modulator 230, 330 and an integrated photonics structure 200, 300 that incorporates the QCSE modulator 230, 330 between a pair of waveguides (i.e., a first waveguide 210, 310 and a second waveguide 220, 320).

The photonic structure 200, 300 can include a semiconductor substrate 201, 301. The semiconductor substrate 201, 301 can, optionally, be doped so as to have a first type conductivity at a relatively low conductivity level. For example, the semiconductor substrate 201, 301 can be a P− silicon substrate.

The photonics structure 200, 300 can further include an insulator layer 202, 302 on the top surface of the semiconductor substrate 201, 301. This insulator layer 202, 302 can be, for example, a SiO₂ layer (also referred to herein as a buried oxide (BOX) layer).

The photonic structure 200, 300 can further include a semiconductor layer 203, 303 on the top surface of the insulator layer 202, 302. The semiconductor layer 203, 303 can have the first type conductivity at a relatively high conductivity level. For example, the semiconductor layer 203, 303 can be a P+ Si layer.

The photonics structure 200, 300 can further include a dielectric layer 205, 305 on the top surface of the semiconductor layer 203, 303. The dielectric layer 205, 305 can be, for example, SiO₂ layer. A trench 260, 360 can extend through the dielectric layer 205, 305 to (or partially into) the semiconductor layer 203, 303. Thus, the bottom of the trench 260, 360 is a semiconductor material surface (e.g., a Si surface) and opposing sidewalls 262, 362 of the trench have dielectric material surfaces (e.g., SiO₂ surfaces). The opposing sidewalls 262, 362 and bottom of the trench could all be planar and the opposing sidewalls 262, 362 could be parallel to each other and perpendicular to bottom of the trench. However, it should be understood that variations due to processing techniques may result in a trench where the opposing sidewalls are tilted (e.g., by 0 to 20 degrees) from perpendicular such that the width of the opening tapers downward from the top of the trench toward the bottom of the trench and/or where the opposing sidewalls and bottom of the trench are curved as opposed to planar. In any case, the maximum distance between the opposing sidewalls 262, 362 of the trench 260, 360 could be less than the maximum distance between opposing ends of the trench. That is, the trench can be longer than it is wide.

The photonics structure 200, 300 can further include a robust quantum-confined Stark effect (QCSE) modulator 230, 330. The QCSE modulator 230, 330 can be a PIN semiconductor structure and can include: a first doped semiconductor region 231, 331 (also referred to herein as a buffer layer) in the trench 260, 360 on the semiconductor layer 203, 303; a multi-quantum well (MQW) region 235, 335 in the trench 260, 360 on the first doped semiconductor region 231, 331; and a second doped semiconductor region 236, 336 on the MQW region 235, 335.

Specifically, the first doped semiconductor region 231, 331 can be at the bottom of the trench 260, 360 above and immediately adjacent to the semiconductor layer 203, 303. The first doped semiconductor region 231, 331 can be an in-situ doped epitaxial semiconductor layer with the first type conductivity at a relatively high conductivity level. For example, the first doped semiconductor region can be a P+ SiGe region. As illustrated, at least an upper portion of the first doped semiconductor region 231, 331 can be above the level of the top surface of the semiconductor layer 203, 303. The first doped semiconductor region 231, 331 can be relatively thick. For example, the first doped semiconductor region 231, 331 can have a thickness within the range of 100-200 nm (e.g., approximately 165 nm).

The MQW region 235, 335 can include a stack of intrinsic (i.e., undoped) epitaxial semiconductor layers. The intrinsic epitaxial semiconductor layers can include alternating quantum well 233, 333 and quantum barrier 232, 332 layers. Specifically, a bottom quantum barrier layer 232$b$, 332$b$ can be above and immediately adjacent to the first doped semiconductor region 231, 331 and a lowermost quantum well layer can be above and immediately adjacent to the bottom quantum barrier layer 232$b$, 332$b$. Additional alternating quantum well and quantum barrier layers can follow with a top quantum barrier layer 232$t$, 332$t$ being above and immediately adjacent to an uppermost quantum well layer. For purposes of illustration, the MQW region 235, 335 shown in the figures has five quantum well layers. It should be understood that the figures are not intended to be limiting and that the MQW region could, alternatively, include any number of two or more quantum well layers, where each quantum well layer is stacked between two quantum barrier layers. In any case, the thicknesses of the quantum barrier layers 232, 332 can all be essentially the same (e.g., +/−0.2 nm) and, for example, within a range from 5-15 nm (e.g., 9.6 nm+/−0.2 nm). Optionally, the inner quantum barrier layers 232, 332 could have essentially the same thicknesses as described above and the bottom quantum barrier layer 232$b$, 332$b$ and/or the top quantum barrier layer 232$t$, 332$t$ can be thicker than the other quantum barrier layers in the stack (e.g., by 1-5 nm or more). The thicknesses of the quantum well layers 233, 333 can all be essentially the same (e.g., +/−0.2 nm) and, for example, within a range from 5-15 nm (e.g., 11.2 nm+/−0.2 nm).

In the MQW region 235, 335, the quantum barrier layers 232, 332 (including the bottom quantum barrier layer 232$b$, 332$b$ and the top quantum barrier layer 232$t$, 232$t$ and all quantum barrier layers in between) and the quantum well layers could all be SiGe layers but with varying Si and Ge percentages. In any case, the quantum well layers can always have a higher percentage of Ge than the quantum barrier layers. The quantum barrier layers can all have the same percentages of Si and Ge. Alternatively, the bottom quantum barrier layer and/or the top quantum barrier layer can have different percentages of Si and Ge than the other quantum barrier layers.

Alternatively, in the MQW region 235, 335, the quantum barrier layers 232, 332 (including the bottom quantum barrier layer 232$b$, 332$b$ and the top quantum barrier layer 232$t$, 232$t$ and all quantum barrier layers in between) can be essentially pure Si layers and the quantum well layers can be either SiGe layers or essentially pure Ge layers. For purposes of this disclosure, an essentially pure Si layer refers to an Si layer that is ideally 100% Si and no less than 99% Si, whereas an essentially pure Ge layer refers to a Ge layer that is ideally 100% Ge and no less than 99% Ge.

Alternatively, in the MQW region 235, 335, the quantum barrier layers 232, 332 (including the bottom quantum barrier layer 232$b$, 332$b$ and the top quantum barrier layer 232$t$, 232$t$ and all quantum barrier layers in between) can be SiGe layers and the quantum well layers can be essentially pure Ge layers. The quantum barrier layers can all have the same percentages of Si and Ge. Alternatively, the bottom quantum barrier layer and/or the top quantum barrier layer can have different percentages of Si and Ge than the other quantum barrier layers.

The second doped semiconductor region 236, 336 can be above and immediately adjacent to the top quantum barrier layer 232$t$, 332$t$. The second doped semiconductor region 236, 336 can be an in-situ doped epitaxial semiconductor layer with the second type conductivity at a relatively high conductivity level. For example, the second doped semiconductor region 236, 336 can be an N+ SiGe region. The second doped semiconductor region 236, 336 can be relatively thick. For example, the second doped semiconductor region 236, 336 can have a thickness within the range of 50-150 nm (e.g., approximately 100 nm).

As mentioned above, the first doped semiconductor region 231, 331 and the second doped semiconductor region 236, 336 can both be doped SiGe regions. It should be noted that the percentages of Si in each of these doped semiconductor regions can be less than the percentage of Si in the quantum barrier layers and more than the percentage of Si in the quantum well layers (and the percentages of Ge in each of these doped semiconductor regions can be greater than the percentage of Ge in the quantum barrier layers and less than the percentage of Ge in the quantum well layers).

Thus, for example, in one exemplary embodiment, the first doped semiconductor region 231, 331 (also referred to herein as the buffer layer) could be a P+ SiGe region with 15% Si and 85% Ge. The quantum barrier layers could all be intrinsic SiGe layers with 29% Si and 71% Ge and the quantum well layers could be intrinsic SiGe layers with 2% Si and 98% Ge Finally, the second doped semiconductor region 236, 336 could be an N+ SiGe region with 15% Si and 85% Ge.

In another exemplary embodiment, the first doped semiconductor region 231, 331 could be a P+ SiGe region with 21% Si and 79% Ge. The quantum barrier layers could all be intrinsic SiGe layers with 35% Si and 65% Ge and the quantum well layers could be intrinsic essentially pure Ge layers. Finally, the second doped semiconductor region 236, 336 could be an N+ SiGe region with 21% Si and 79% Ge.

It should be understood that the descriptions of the various layers of the QCSE modulator 230, 330 described above are not intended to be limiting. Different percentages of Si or Ge in the doped semiconductor regions 231/236, 331/336 or in the quantum barrier layers 232, 332 and/or quantum well layers 233, 333 of the MQW region 235, 335 could alternatively be employed. Optionally, within the MQW region 235, 335, quantum dots (not shown) could also be embedded into the quantum well layers 233, 333. Such differences could be designed into the QCSE modulator 230, 330 in order to achieve a particular electric field across the MQW region 235, 335 in response to biasing of the doped semiconductor region(s) 231/236, 331/336 and, thereby to achieve the desired modulation of a light signal that passes through the QCSE modulator 230, 330 from one waveguide 210, 310 at one end of the QCSE modulator 230, 330 to another waveguide 220, 320 at the opposite end of the QCSE modulator 230, 330.

In any case, as discussed in greater detail below with regard to the method embodiments (and similarly as discussed above with regard to the prior art modulator shown in FIG. 1B), during epitaxial growth of the first doped semiconductor region and during epitaxial growth of the alternating quantum barrier and quantum well layers of the MQW region 235, 335, semiconductor deposition can be selective to the semiconductor material surface at the bottom of the trench 260, 360 over the dielectric material surfaces at the opposing sidewalls 262, 362 of the trench 260, 360. Thus, at least upper segments of the opposing sidewalls 261, 361 of the MQW region 235, 335 are angled away and physically separated from the opposing sidewalls 262, 362 of the trench 260, 360 (as opposed to being flush with and immediately adjacent to the trench sidewalls 262, 362). As a result, the width of the MQW region 235, 335 tapers from the bottom toward the top of the region (i.e., as the distance from the first doped semiconductor region 231, 331 increases) and there are spaces in the trench 260, 360 between at least the upper segments of the MQW region sidewalls 261, 361 and the trench sidewalls 262, 362. In order to avoid defects caused by epitaxial semiconductor material for the second doped semiconductor region 236, 336 being deposited into the spaces, the embodiments of the QCSE modulator 230, 330 disclosed herein also include dielectric spacers 255, 355.

Figure 2A:
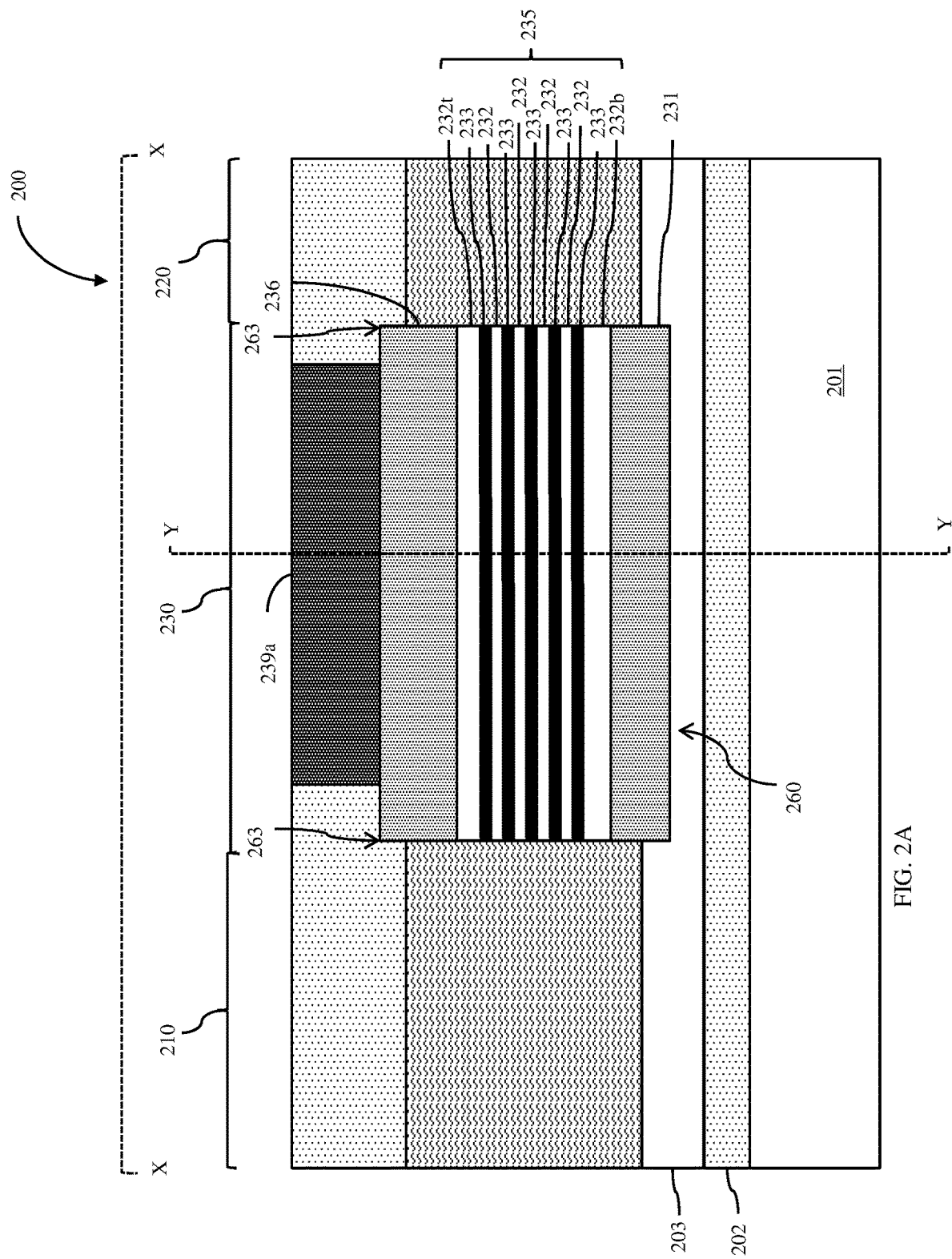
FIGS. 2A and 2B are cross-section drawings illustrating embodiments of QCSE modulator and a photonics structure that incorporates the QCSE modulator between a pair of waveguides.
Figure 2B:
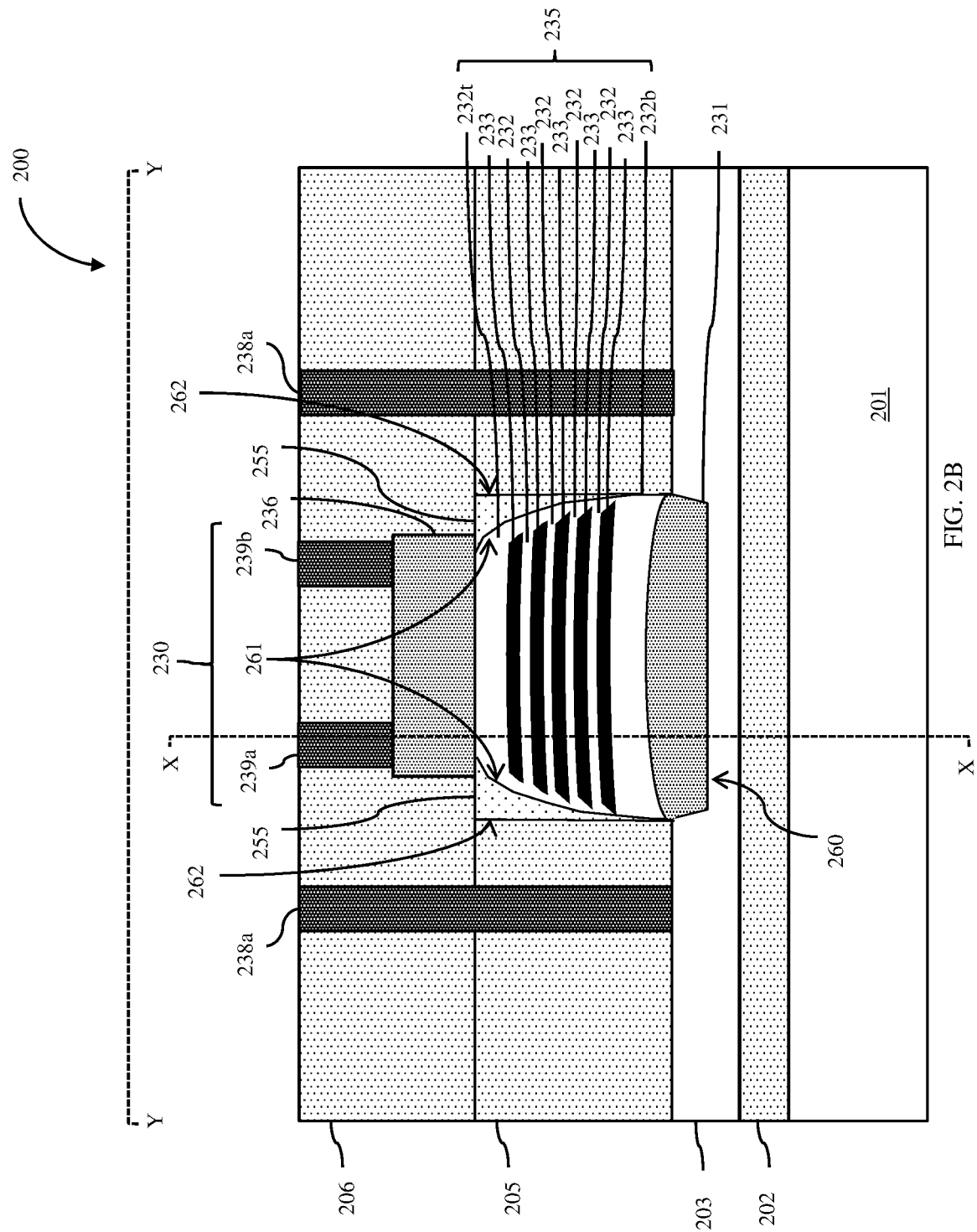

More specifically, in the QCSE modulator 230 of the photonics structure 200 in FIGS. 2A-2B, dielectric spacers 255 are within the trench 260 on the MQW region sidewalls 261 such that they fill the spaces between the MQW region sidewalls 261 and the trench sidewalls 262. The top surfaces of the dielectric spacers 255 are essentially co-planar (e.g., +/−0 to 0.5 nm) with the top surfaces of the dielectric layer 205 and the top quantum barrier layer 232t of the multi-quantum well region 235. As mentioned above, the second doped semiconductor region 236 can be on the top surface of the top quantum barrier layer 232t. Optionally, the second doped semiconductor region 236 can further extend laterally onto the dielectric spacers 255 so that the dielectric spacers 255 are partially covered by the second doped semiconductor region 236.

Figure 3A:
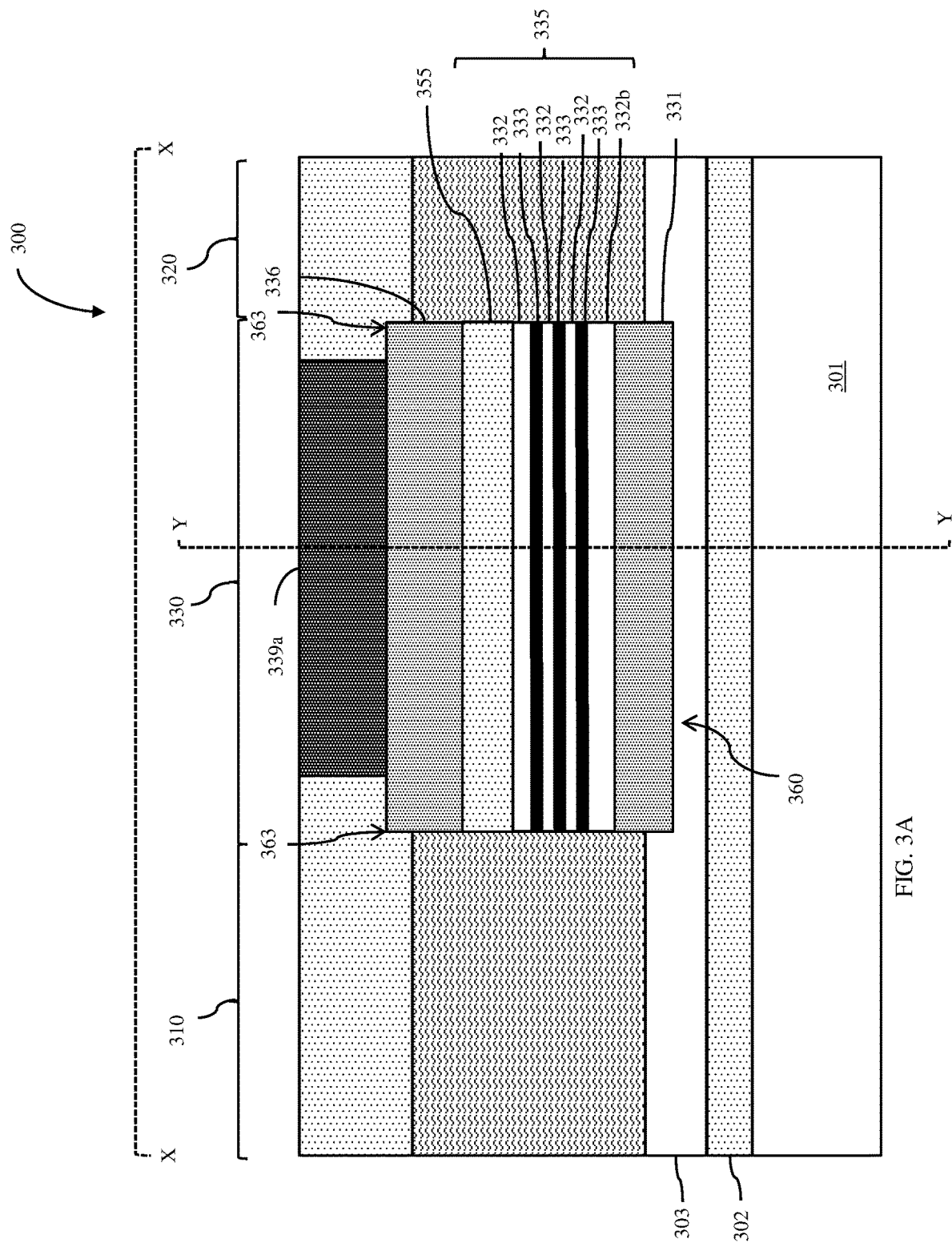
FIGS. 3A and 3B are cross-section drawings illustrating other embodiments of QCSE modulator and a photonics structure that incorporates the QCSE modulator between a pair of waveguides.
Figure 3B:
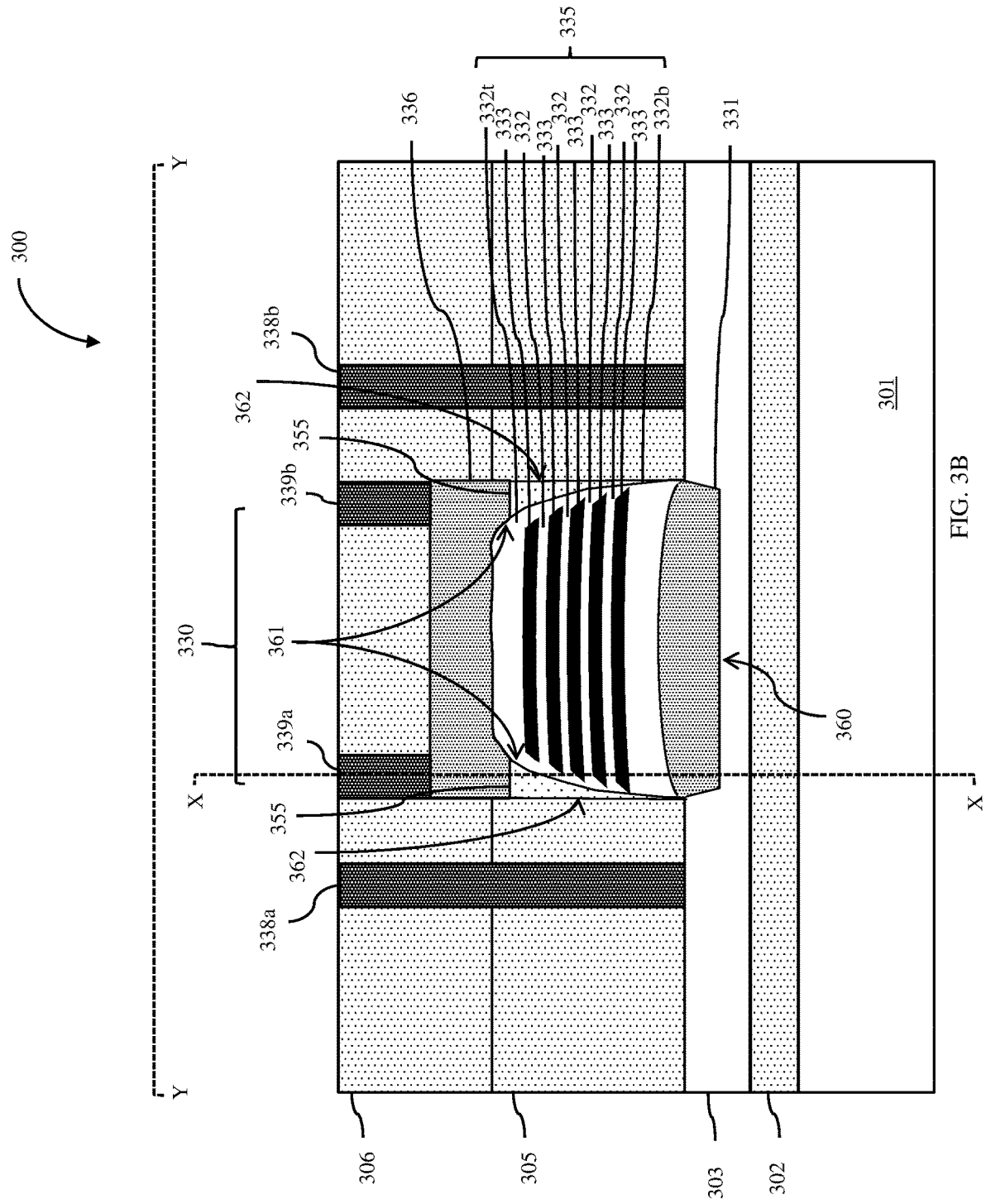

Alternatively, in the QCSE modulator 330 of the photonics structure 300 in FIGS. 3A-3B, dielectric spacers 355 are within the trench 360 on the MQW region sidewalls 361 in the spaces between the MQW region sidewalls 361 and the trench sidewalls 362. However, the top surfaces of the dielectric spacers 355 are recessed and, more particularly, are at a lower level than the top surfaces of the dielectric layer 305 and the top quantum barrier layer 332t of the multi-quantum well region 335. As mentioned above, the second doped semiconductor region 336 can be on the top surface of the top quantum barrier layer 332t. In this case, the second doped semiconductor region 336 covers the top surface of the top quantum barrier layer 332t and further extends laterally from the sides of the upper portion of the MQW region 335 over the dielectric spacers 355 to the trench sidewalls 362.

It should be noted that the dielectric spacers 255, 355 could be made of the same dielectric material as the dielectric layer 205, 305. For example, the dielectric spacers 255, 355 can be SiO$_2$ spacers. Alternatively, the dielectric spacers 255, 355 and the dielectric layer 205, 305 can be made of different dielectric materials. For example, the dielectric layer 205, 305 can be a SiO$_2$ layer and the dielectric spacers 255, 355 can be silicon nitride (SiN) spacers, silicon oxynitride (SiON) spacers, or spacers made of any other suitable dielectric material.

The QCSE modulator 230, 330 can further include an additional dielectric layer 206, 306 on the dielectric layer 205, 305 and covering the second doped semiconductor region 236, 336. In the QCSE modulator 230, the additional dielectric layer 206 is also above and immediately adjacent to at least those portions of the dielectric spacers 255 closest to the trench sidewalls 262. The additional dielectric layer 206, 306 can be the same dielectric material as the dielectric layer 205, 305. For example, the additional dielectric layer 206, 306 can be a SiO$_2$ layer. Alternatively, the additional dielectric layer 206, 306 and the dielectric layer 205, 305 can be different dielectric materials. For example, the dielectric layer 205, 305 can be a silicon dioxide layer and the additional dielectric layer 206, 306 can be a silicon nitride layer, a silicon oxynitride layer, or any other suitable dielectric layer. It should be understood that selection of the dielectric material for the dielectrics is typically made so that these same layers can also function cladding materials for the waveguides 210/220, 310/320.

In any case, the QCSE modulator 230, 330 can further include one or more top metal contacts that extend vertically through the additional dielectric layer 206, 306 to the top surface of the second doped semiconductor region 236, 336. For example, the QCSE modulator 230, 330 could include a pair of top metal contacts 239a-239b, 339a-339b that extend vertically to the outer edge portions of the second doped semiconductor region 236, 336. It should be noted that, since in the QCSE modulator 330 of FIGS. 3A-3B, the second doped semiconductor region 336 extends laterally to the trench sidewalls 362, the top metal contacts 339a-339b can be aligned above the dielectric spacers 355 for optimal performance. Additionally, the top metal contact(s) 239a-239b, 339a-339b can extend a significant portion or the full length of the QCSE modulator 230 (as shown in XX cross-section diagrams of FIGS. 2A and 3A). Top metal contacts 239a-239b, 339a-339b enable biasing of the second doped semiconductor region 236, 336 (which can be an N+ SiGe region).

The QCSE modulator 230, 330 can further include one or more bottom contacts that extend through the additional dielectric layer 206, 306 and the dielectric layer 205, 305 down to the semiconductor layer 203, 303. For example, the QCSE modulator 230, 330 could include a pair of bottom metal contacts 238a-238b, 338a-338b that extend vertically through the dielectric layers on either side of the trench 260, 360. As mentioned above, the semiconductor layer 203, 303 can have the first type conductivity. For example, the semiconductor layer 203, 303 can be a P+Si layer. Thus, by contacting the semiconductor layer 203, 303, the bottom metal contacts 238a-238b, 338a-338b enable biasing of the first doped semiconductor region 231, 331 (which can be a P+ SiGe region).

As mentioned above, in the photonics structure 200, 300, the QCSE modulator 230, 330 can be located at the interface between a pair of waveguides (i.e., a first waveguide 210, 310 and a second waveguide 220, 320). As shown in the cross-section diagrams of FIGS. 2A and 3B, the first waveguide 210, 310 and the second waveguide 220, 320 can be at opposing ends 263, 363 of the QCSE modulator 230, 330 such that the waveguides and the QCSE modulator are in end-to-end alignment. The core material for the first and second waveguides can be polysilicon. Alternatively, the core material for the first and second waveguides could be any other suitable waveguide core material (e.g., silicon nitride (SiN)). The cladding material for the first and second waveguides can be the surrounding dielectric material. It should be noted that the structures of the waveguides 210/220, 310/320 shown in the figures are for illustration purposes only. Alternatively, any other suitable waveguide structures, which can be readily integrated into silicon processing, could be positioned on the opposing ends of the QCSE modulator 230, 330.

In operation, in this photonics structure 200, 300 one or both of the doped semiconductor regions 231/236, 331/336 can be selectively biased in order to selectively change the electrical field across the MQW region 235, 335 and, in turn, to fine-tune the absorption coefficient of the QCSE modulator 230, 330. By fine-tuning the absorption coefficient, the amplitude of light intensity passing from one waveguide to the next (e.g., from the first waveguide 210, 310 to the second waveguide 220, 320) can be selectively modulated (i.e., adjusted, changed, etc.). That is, selective biasing of the doped semiconductor regions can be employed to modulate a light signal that passes between the waveguides. In the embodiments disclosed herein, the dielectric spacers 255, 355 prevent the occurrence of shorts between the first doped semiconductor region 231, 331 and the second doped semiconductor region 236, 336. Thus, the dielectric spacers 255, 355 prevent current paths from developing, which would bypass the MQW region 235, 335 and negatively impact the QCSE modulator's ability achieve the desired electric field across the MQW region 235, 335 in response to selective biasing of the doped semiconductor regions 231/236, 331/336. Such dielectric spacers 25, 355 can also minimize the occurrence of a non-uniform electric field across the MQW region 235, 335 during selective biasing of the doped semiconductor region 231/236, 331/336 due to the presence of fewer quantum wells at the sides of the MQW region 235, 335 as compared to the center.

Figure 4:
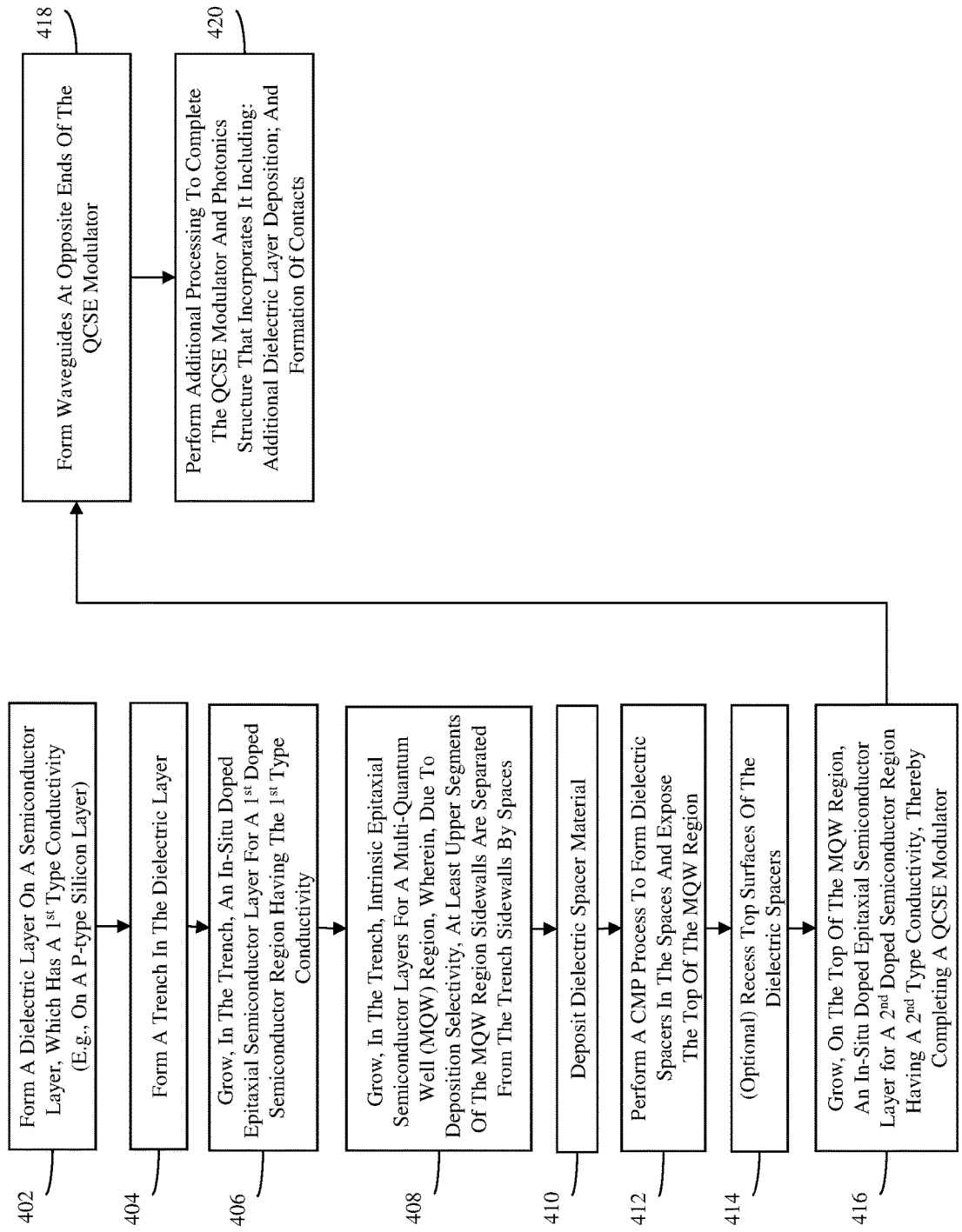
FIG. 4 is a flow diagram illustrating method embodiments for forming a QCSE modulator and photonics structure that incorporates the QCSE modulator between a pair of waveguides.

Referring to the flow diagram of FIG. 4, also disclosed herein are method embodiments for forming a QCSE modulator 230, 330 and a photonics structure 200, 300 that incorporates that QCSE modulator (see FIGS. 2A-2B and FIGS. 3A-3B and the detailed description of the structure embodiments above).

The method embodiments can include providing a semiconductor-on-insulator (SOI) structure. The (SOI) structure can include a semiconductor substrate 201, 301. The semiconductor substrate 201, 301 can, optionally, be doped so as to have a first type conductivity at a relatively low conductivity level. For example, the semiconductor substrate 201, 301 can be P− Si substrate. The SOI structure can further include an insulator layer 202, 302 on the top surface of the semiconductor substrate 201, 301. This insulator layer 202, 302 can be, for example, a SiO$_2$ layer (also referred to herein as a buried oxide (BOX) layer). The SOI structure can further include a semiconductor layer 203, 303 on the top surface of the insulator layer 202, 302. The semiconductor layer 203, 303 can have the first type conductivity at a relatively high conductivity level. For example, the semiconductor layer 203, 303 can be a P+Si layer.

Figure 5:
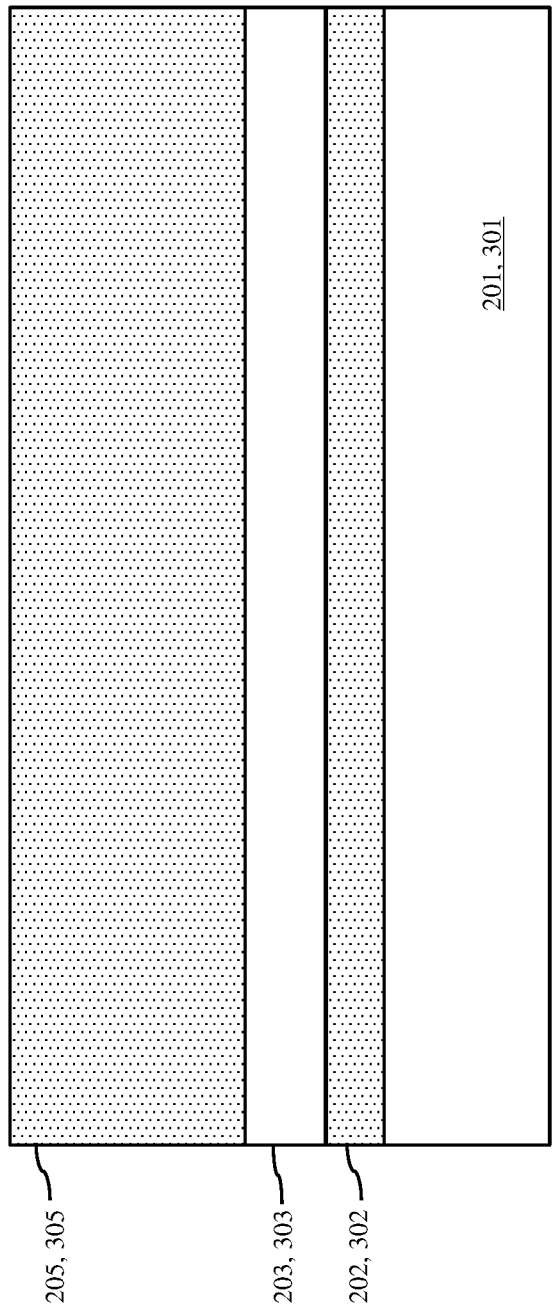
FIGS. 5-12 are cross-section diagrams illustrating partially completed structures formed according to the flow diagram of FIG. 4.
Figure 6:
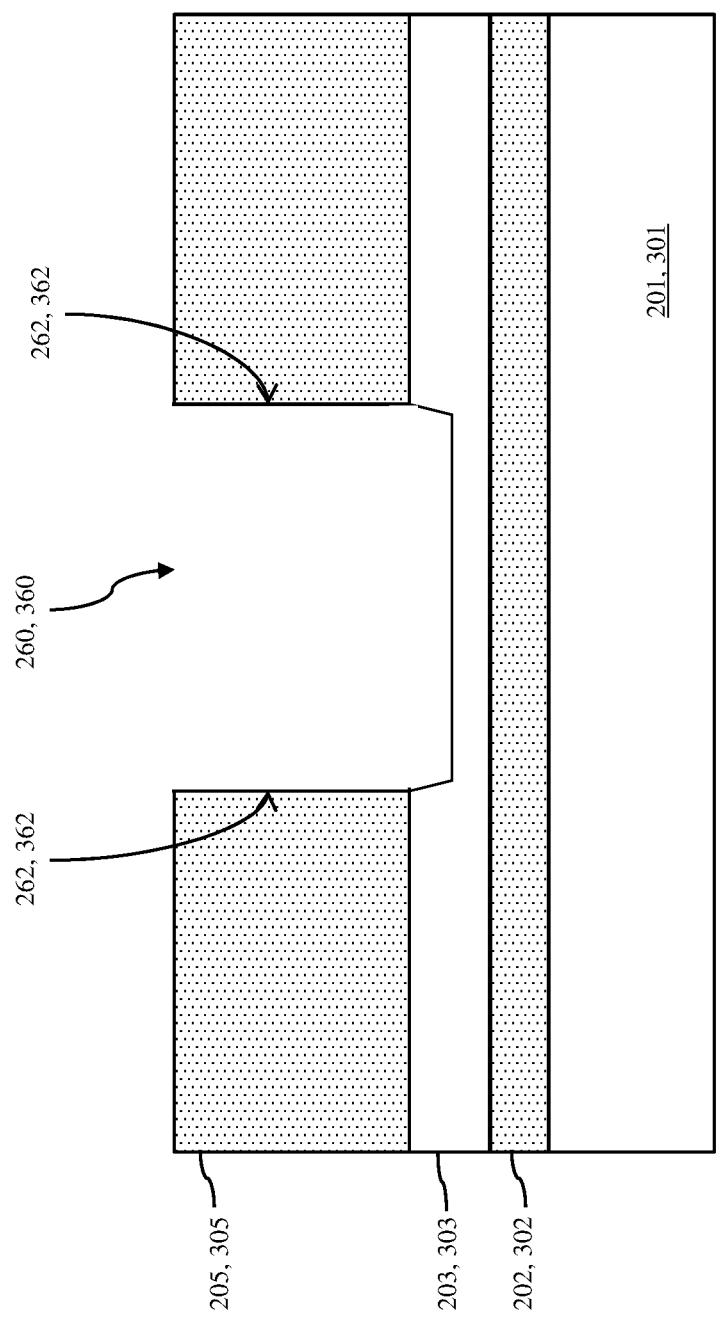

The method embodiments can include forming a dielectric layer 205, 305 on the top surface of the semiconductor layer 203, 303 (see process step 402 and FIG. 5). The dielectric layer 205, 305 can be, for example, a SiO$_2$ layer. A trench 260, 360 can be formed (e.g., lithographically patterned and etched) into the dielectric layer 205, 305 such that it extends essentially vertically through the dielectric layer 205, 305 to (or partially into) the semiconductor layer 203, 303 (see process step 404 and FIG. 6). As a result of process step 404, opposing sidewalls 262, 362 and bottom of the trench could all be planar and the opposing sidewalls 262, 362 could be parallel to each other and perpendicular to bottom of the trench. However, it should be understood that variations due to processing techniques may result in a trench where the opposing sidewalls are tilted (e.g., by 0 to 20 degrees) from perpendicular such that the width of the opening tapers downward from the top of the trench toward the bottom of the trench and/or where the opposing sidewalls and bottom of the trench are curved as opposed to planar. In any case, as a result of process step 404, the bottom of the trench 260, 360 is a semiconductor material surface (e.g., a Si surface) and the opposing sidewalls 262, 362 of the trench have dielectric material surfaces (e.g., SiO$_2$ surfaces). It should be noted that the trench could be patterned and etched such that the distance between the opposing sidewalls 262, 362 of the trench 260, 360 is less than the distance between opposing ends of the trench 260, 360. That is, the trench can be longer than it is wide.

The method embodiments can further include forming a QCSE modulator 230, 330, as described in detail above and illustrated in FIGS. 2A-2B and 3A-3B, on the partially completed structure (see process steps 406-416). Specifically, the steps employed for forming a QCSE modulator 230, 330 can include depositing (e.g., epitaxially growing), into the trench 260, 360 on the semiconductor layer 203, 303, a first in-situ doped semiconductor layer for a first doped semiconductor region 231, 331 (also referred to herein as a buffer layer) having the first type conductivity at a relatively high conductivity level (see process step 406 and FIG. 7). For example, at process step 406, a SiGe layer can be epitaxially grown and in-situ doped with a P-type dopant such that the resulting first doped semiconductor region 231, 331 is a P+ SiGe region. As illustrated, process step 406 can be performed so that at least an upper portion of the first doped semiconductor region 231, 331 is above the level of the top surface of the semiconductor layer 203, 303 and further so that the first doped semiconductor region 231, 331 is relatively thick. For example, process step 406 can be performed so that the first doped semiconductor region 231, 331 has a thickness within the range of 100-200 nm (e.g., approximately 165 nm).

Figure 7:
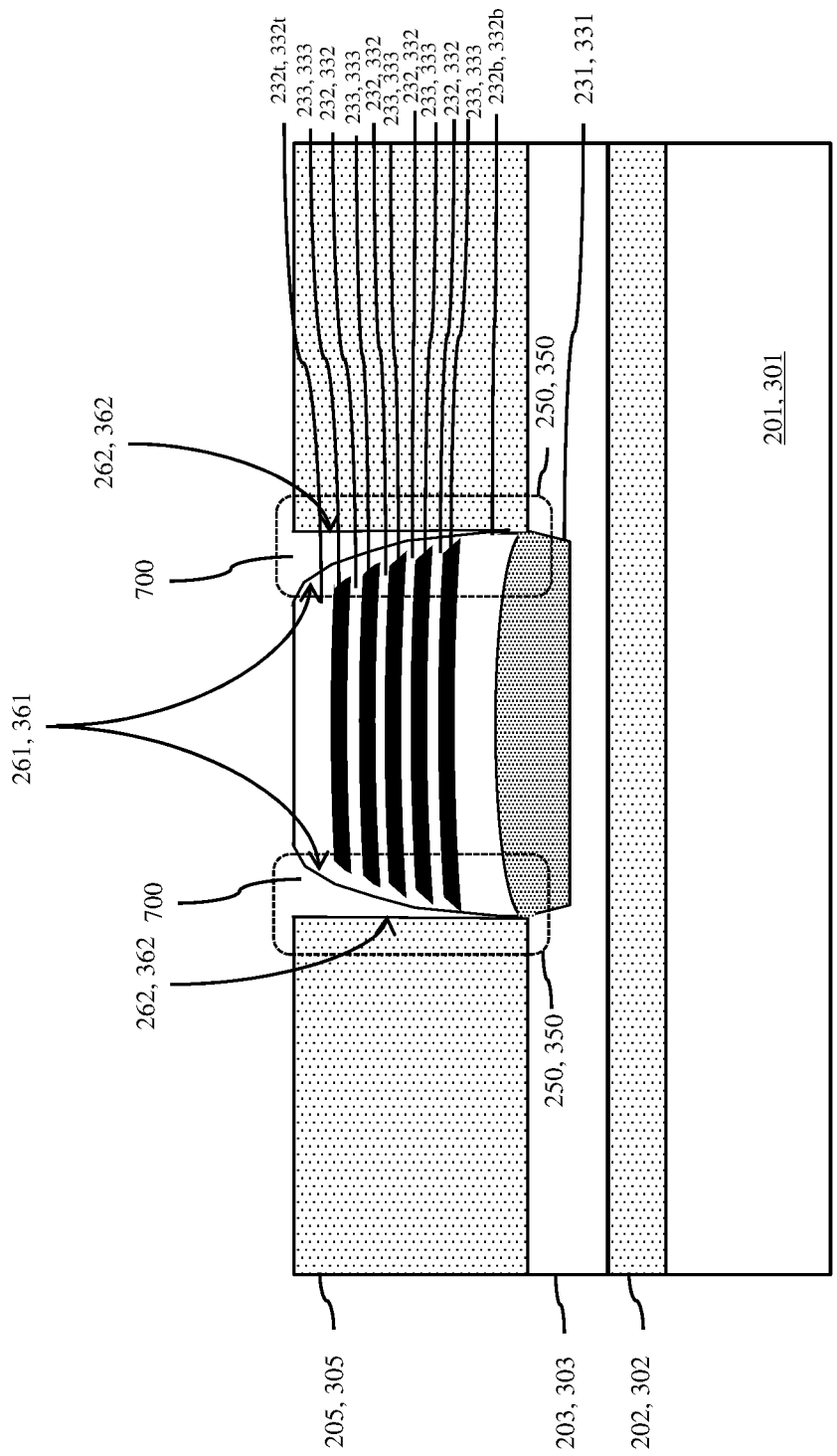

A stack of intrinsic semiconductor layers for an MQW region 235, 335 can be deposited into (e.g., epitaxially grown in) the trench 260, 360 on the first doped semiconductor region 231, 331 (see FIG. 7 and process step 408). The stack of intrinsic epitaxial semiconductor layers can include alternating quantum well 233, 333 and quantum barrier 232, 332 layers. Specifically, a bottom quantum barrier layer 232b, 332b can be epitaxially grown above and immediately adjacent to the first doped semiconductor region 231, 331 and a lowermost quantum well layer can be epitaxially grown above and immediately adjacent to the bottom quantum barrier layer 232b, 332b. Epitaxial growth of additional alternating quantum well and quantum barrier layers can follow with a top quantum barrier layer 232t, 332t being above and immediately adjacent to an uppermost quantum well layer.

Process step 408 can be performed such that, in the MQW region 235, 335, the quantum barrier layers 232, 332 (including the bottom quantum barrier layer 232b, 332b and the top quantum barrier layer 232t, 232t and all quantum barrier layers in between) and the quantum well layers could all be SiGe layers but with varying Si and Ge percentages. In any case, the quantum well layers can be epitaxially grown so that they have higher percentage of Ge than the quantum barrier layers. Furthermore, the quantum barrier layers can be epitaxially grown so that they all have the same percentages of Si and Ge. Alternatively, the quantum barrier layers can be epitaxially grown so that the bottom quantum barrier layer and/or the top quantum barrier layer have different percentages of Si and Ge than the other quantum barrier layers.

Alternatively, process step 408 can be performed such that, in the MQW region 235, 335, the quantum barrier layers 232, 332 (including the bottom quantum barrier layer 232b, 332b and the top quantum barrier layer 232t, 232t and all quantum barrier layers in between) are essentially pure Si layers and the quantum well layers are either SiGe layers or essentially pure Ge layers. For purposes of this disclosure, an essentially pure Si layer refers to an Si layer that is ideally 100% Si and no less than 99% Si, whereas an essentially pure Ge layer refers to a Ge layer that is ideally 100% Ge and no less than 99% Ge.

Alternatively, process step 408 can be performed such that, in the MQW region 235, 335, the quantum barrier layers 232, 332 (including the bottom quantum barrier layer 232b, 332b and the top quantum barrier layer 232t, 232t and all quantum barrier layers in between) are SiGe layers and the quantum well layers are essentially pure Ge layers. Furthermore, the quantum barrier layers can be epitaxially grown so that they all have the same percentages of Si and Ge. Alternatively, the quantum barrier layers can be epitaxially grown so that the bottom quantum barrier layer and/or the top quantum barrier layer have different percentages of Si and Ge than the other quantum barrier layers.

For purposes of illustration, the MQW region 235, 335 shown in the figures has five quantum well layers. It should be understood that the figures are not intended to be limiting and that the MQW region 235, 335 could, alternatively, include any number of two or more quantum well layers, where each quantum well layer is stacked between two quantum barrier layers. In any case, process step 408 can be performed such that the thicknesses of the quantum barrier layers 232, 332 are all essentially the same (e.g., +/−0.2 nm) and, for example, within a range from 5-15 nm (e.g., 9.6 nm+/−0.2 nm). Optionally, process step 408 can be performed so that the inner quantum barrier layers have essentially the same thicknesses as described above but the bottom quantum barrier layer 232b, 332b and/or the top quantum barrier layer 232t, 332t are thicker than the other quantum barrier layers in the stack (e.g., by 1-5 nm or more). Process step 408 can further be performed so that the thicknesses of the quantum well layers 233, 333 can all be essentially the same (e.g., +/−0.2 nm) and, for example, within a range of 5-15 nm (e.g., 11.2 nm+/−0.2 nm).

It should be noted that, during process steps 406-408 used to form the first doped semiconductor region and the alternating quantum barrier and quantum well layers of the MQW region 235, 335, epitaxial semiconductor growth can be selective to the semiconductor material surface at the bottom of the trench 260, 360 over the dielectric material surfaces at the opposing sidewalls 262, 362 of the trench 260, 360. For example, the epitaxial SiGe being grown may not wet the $SiO_2$ sidewalls of the trench because the chemical potential for SiGe nucleation on $SiO_2$ sidewalls is much higher than the chemical potential for SiGe nucleation on crystalline Si, Ge or SiGe. This results in faceting of the outer edges of the SiGe layers adjacent to the trench sidewalls 262, 362. Thus, the width of the resulting MQW region 235, 335 tapers from the bottom toward the top of the region (i.e., as the distance from the first doped semiconductor region 231, 331 increases), at least upper segments of the MQW region sidewalls 261, 361 are angled away and physically separated from the trench sidewalls 262, 362 (as opposed to being flush with and immediately adjacent to the trench sidewalls 262, 362) and there are spaces 700 between the trench sidewalls 262, 362 and MQW sidewalls 261, 361.

Figure 8:
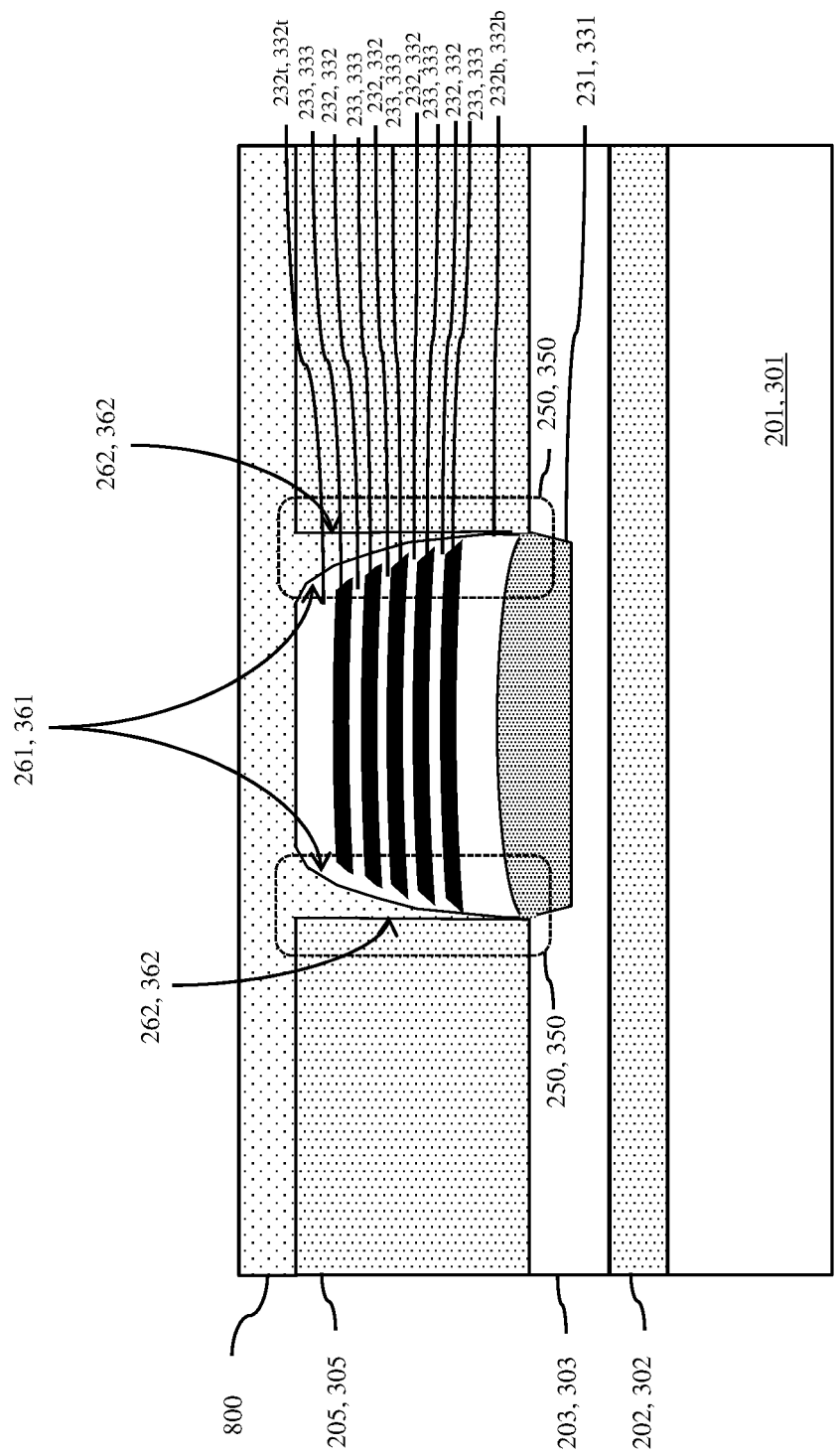
Figure 9:
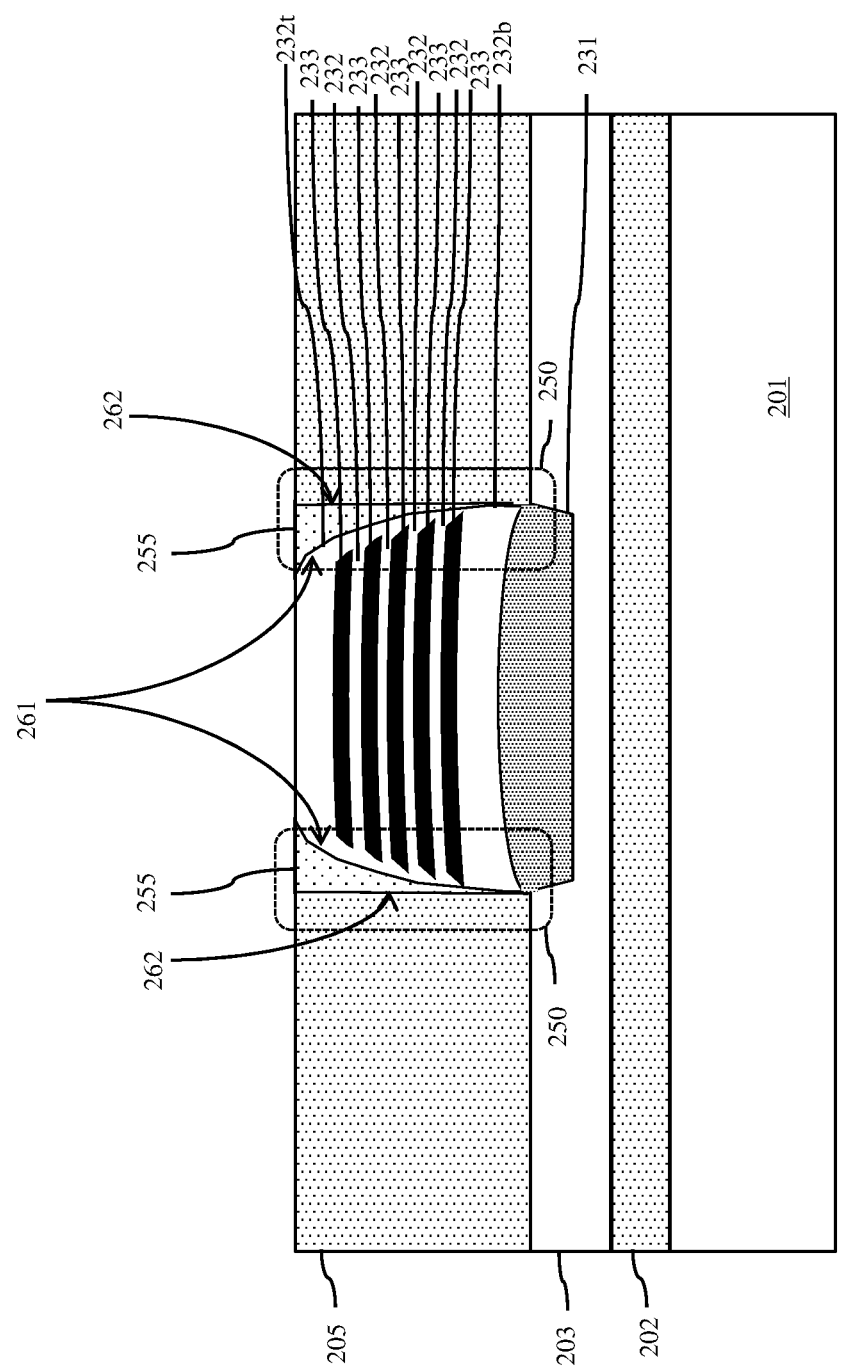

The method embodiments can further include forming dielectric spacers 255, 355 within these spaces 700. Specifically, dielectric spacer material 800 can be deposited over the partially completed structure so as to fill the spaces 700 (see process step 410 and FIG. 8). The dielectric spacer material can be the same dielectric material as the dielectric layer 205, 305 or, alternatively, some other suitable dielectric material. For example, the dielectric spacer material can be $SiO_2$, SiN, SiON or any other suitable dielectric spacer material. A chemical mechanical polishing (CMP) process can subsequently be performed in order to remove the dielectric spacer material from the top surface of the dielectric layer 205, 305 and to expose the top of the MQW region 235, 335 (i.e., to expose the top surface of the top quantum barrier layer 232t, 332t), thereby forming dielectric spacers 255, 355 in the spaces 700 (see process step 412 and FIG. 9).

Figure 10:
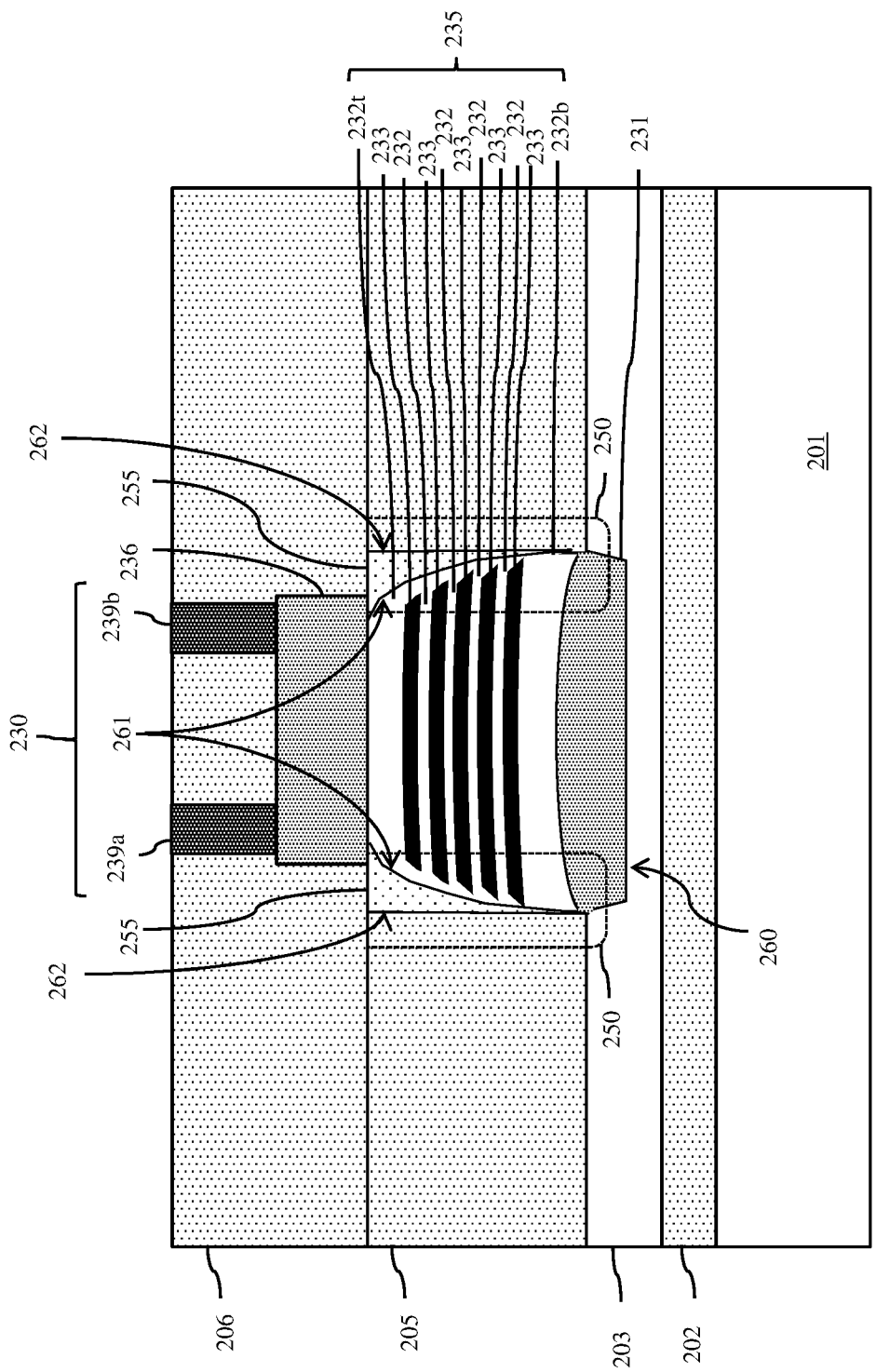

To form the photonics structure 200 of FIGS. 2A-2B including the QCSE modulator 230, a second in-situ doped semiconductor layer for a second doped semiconductor region 236 having a second type conductivity at a relatively high conductivity level can be epitaxially grown on the exposed top surface of the top quantum barrier layer 232t (see process step 416 and FIG. 10). For example, at process step 416, a SiGe layer can be epitaxially grown and in-situ doped with a N-type dopant such that the resulting second doped semiconductor region 236 is a N+ SiGe region. As illustrated, process step 416 can be performed so that the second doped semiconductor region 236 is relatively thick. For example, process step 416 can be performed so that the second doped semiconductor region 236 has a thickness within the range of 50-150 nm (e.g., approximately 100 nm). Optionally, process step 410 can be performed so that outer edge portions of the second doped semiconductor region 236 extend onto and partially cover the adjacent dielectric spacers 255.

Figure 11:
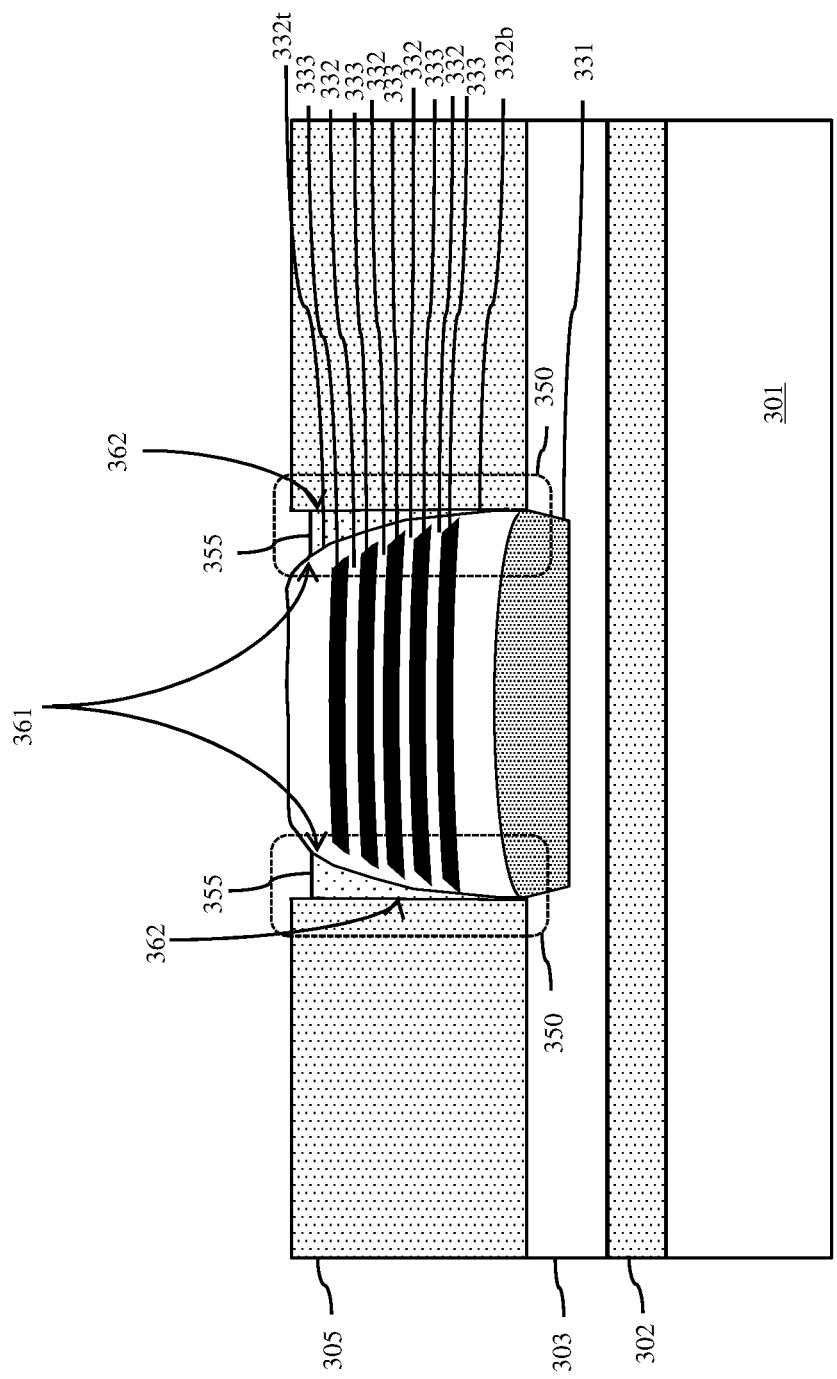

Alternatively, to form the photonics structure 300 of FIGS. 3A-3B including the QCSE modulator 330, the top surfaces of the dielectric spacers 355 can be recessed (i.e., etched back) by a selective anisotropic etch process so that they are at a lower level than the top surfaces of the dielectric layer 305 and the top quantum barrier layer 332t of the multi-quantum well region 335 and so that upper surfaces of the trench sidewalls 362 and MQW region sidewalls 361 are exposed (see optional process step 414 and FIG. 11). Then, process step 416 can be performed. However, in this case, the second in-situ doped semiconductor layer (e.g., an N+ SiGe layer) for the second doped semiconductor region 336 (e.g., an N+ SiGe region) is epitaxially grown on the exposed top surface of the top quantum barrier layer 332t as well as the exposed upper surfaces of the MQW region sidewalls 361 such that it grows both vertically and laterally (see process step 416 and FIG. 12). In this case, process step 416 is performed so that the resulting second doped semiconductor region 336 covers the top surface of the top quantum barrier layer 332t and further extends laterally from the MQW region sidewalls 361 over the dielectric spacers 355 to the trench sidewalls 361.

As mentioned above, the first doped semiconductor region 231, 331 formed at process step 406 and the second doped semiconductor region 236, 336 formed at process step 416 can both be doped SiGe regions. It should be noted that the percentages of Si in each of these doped semiconductor regions can be less than the percentage of Si in the quantum barrier layers and more than the percentage of Si in the quantum well layers (and the percentages of Ge in each of these doped semiconductor regions can be greater than the percentage of Ge in the quantum barrier layers and less than the percentage of Ge in the quantum well layers) formed at process step 408.

Thus, for example, in one exemplary embodiment, the first doped semiconductor region 231, 331 (also referred to herein as the buffer layer) formed at process step 406 could be a P+ SiGe region with 15% Si and 85% Ge. The quantum barrier layers formed at process step 408 could all be intrinsic SiGe layers with 29% Si and 71% Ge and the quantum well layers, which are also formed at process step 408, could be intrinsic SiGe layers with 2% Si and 98% Ge. Finally, the second doped semiconductor region 236, 336 formed at process step 416 could be an N+ SiGe region with 15% Si and 85% Ge.

In another exemplary embodiment, the first doped semiconductor region 231, 331 formed at process step 406 could be a P+ SiGe region with 21% Si and 79% Ge. The quantum barrier layers formed at process step 408 could all be intrinsic SiGe layers with 35% Si and 65% Ge and the quantum well layers, which are also formed at process step 408, could be intrinsic essentially pure Ge layers. Finally, the second doped semiconductor region 236, 336 formed at process step 416 could be an N+ SiGe region with 21% Si and 79% Ge.

Figure 12:
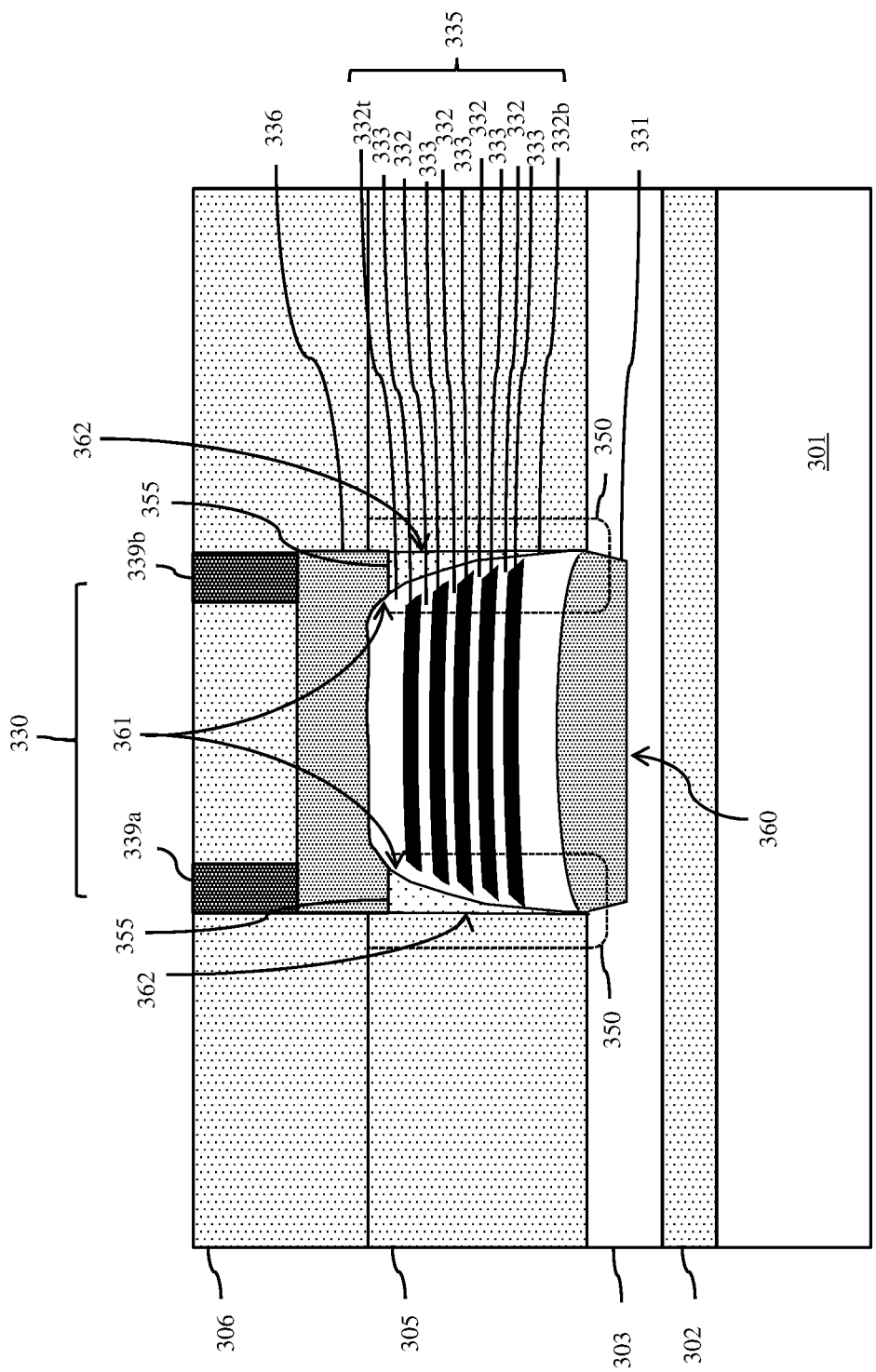

In any case, formation of the second doped semiconductor region 236 as shown in FIG. 10) or 336 (as shown in FIG. 12) effectively completes formation of the QCSE modulator 230, 330 (except for additional processing mentioned below to form contacts at process step 420).

The method embodiments can further include forming waveguides (e.g., a first waveguide 210, 310 and a second waveguide 220, 320) at opposite ends of the MQW region 235, 335 of the QCSE modulator 230, 330 (see process step 418 and FIGS. 2A-2B and 3A-3B). Various different methods of forming waveguide structures on a semiconductor-on-insulator wafer adjacent to a QCSE modulator are well known in the art and can be incorporated into the method embodiments disclosed herein. Thus, the details of waveguide formation have been omitted from this specification in order to allow the reader to focus on the salient aspects of the disclosed methods. However, one exemplary process flow for forming the waveguides can include: forming an elongated waveguide in the dielectric layer (using conventional waveguide formation techniques; forming the trench in the dielectric layer such that it bisects the elongated waveguide, thereby forming two waveguides separated by the trench; and then forming the QCSE modulator 230, 330 (as described above). Another exemplary process flow could include: after forming the QCSE modulator 230, 330 in the dielectric layer, forming additional trenches in the dielectric layer at opposite ends of the QCSE modulator 230, 330 (e.g., using conventional lithographic patterning and etch techniques) so as to leave vertical end surfaces of the QCSE modulator exposed and, particularly, so as to leave vertical end surfaces of the doped semiconductor regions and all the alternating quantum barrier and well layers of the MQW region 235, 335 exposed; and then depositing core material (e.g., polysilicon, silicon nitride or any other suitable core material) for the waveguides into the additional trenches adjacent to the exposed vertical end surfaces, respectively, of the QCSE modulator such that the QCSE modulator 230, 330 and waveguides will be in end-to-end alignment.

Additional process steps can subsequently be performed in order to complete the QCSE modulator 230, 330 and the photonic structure 200, 300 that incorporates the QCSE modulator 230, 330 (see process step 420 and FIGS. 2A-2B and 3A-3B). The additional process steps can include, but are not limited to: formation of an additional dielectric layer 206, 306 over the partially completed structure; formation of top metal contact(s) 239a-239b, 339a-339b that extend vertically through the additional dielectric layer 206, 306 to the second doped semiconductor region 236, 336 (e.g., at the outer edge portions of second doped semiconductor region); and formation of bottom metal contact(s) 238a-238b, 338a-338b that extend through the additional dielectric layer 206, 306 and the dielectric layer 205, 305 to the semiconductor layer 203, 303 (e.g., on opposite sides of the QCSE modulator 230, 330). Middle of the line (MOL) processing techniques for dielectric deposition and contact formation are well known in the art. Thus, the details thereof have been omitted from this specification in order to allow the reader to focus on the salient aspects of the disclosed methods.

It should be understood that in the structures and methods described above, a semiconductor material refers to a material whose conducting properties can be altered by doping with an impurity (also referred to herein as a dopant). Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. A semiconductor material can be doped using a dopant implant process. Alternatively, if a semiconductor material is being deposited using an epitaxial growth process, it can be in-situ doped (i.e., doped as it is being epitaxially grown).

Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A modulator comprising:
    a first doped semiconductor region having a first type conductivity, wherein the first doped semiconductor region is at a bottom of a trench that extends through a dielectric layer to a semiconductor layer;
    a multi-quantum well region in the trench on the first doped semiconductor region, wherein the trench has first sidewalls and the multi-quantum well region has second sidewalls adjacent to the first sidewalls, respectively, wherein a width of the multi-quantum well region narrows toward a top of the trench, wherein at least upper segments of the second sidewalls of the multi-quantum well region are physically separated from the first sidewalls of the trench by spaces that widen toward the top of the trench;
    dielectric spacers filling the spaces between the first sidewalls of the trench and the second sidewalls of the multi-quantum well region, wherein widths of the dielectric spacers increase toward the top of the trench; and
    a second doped semiconductor region on the multi-quantum well region, wherein the second doped semiconductor region has a second type conductivity that is different from the first type conductivity.

2. The modulator of claim 1,
    wherein top surfaces of the dielectric spacers are essentially co-planar with top surfaces of the dielectric layer and the multi-quantum well region, and
    wherein the modulator further comprises top contacts on outer edge portions of the second doped semiconductor region.

3. The modulator of claim 1,
    wherein top surfaces of the dielectric spacers are below a level of a top surface of the dielectric layer and below a level of a top surface of the multi-quantum well region,
    wherein the second doped semiconductor region extends laterally across the top surfaces of the dielectric spacers to the first sidewalls of the trench, and
    wherein the modulator further comprises top contacts on outer edge portions of the second doped semiconductor region aligned above the dielectric spacers.

4. The modulator of claim 1, wherein the dielectric layer and the dielectric spacers comprise a same dielectric material.

5. The modulator of claim 1, wherein the dielectric layer and the dielectric spacers comprise different dielectric materials.

6. The modulator of claim 1,
    wherein the semiconductor layer comprises a P-type silicon layer,
    wherein the first doped semiconductor region comprises a P-type epitaxial silicon germanium layer,
    wherein the multi-quantum well region comprises a stack of intrinsic epitaxial semiconductor layers comprising:
        a bottom quantum barrier layer;
        alternating quantum well and quantum barrier layers with a lower most quantum well layer being above and immediately adjacent to the bottom quantum barrier layer; and
        a top quantum barrier layer above and immediately adjacent to an uppermost quantum well layer,
    wherein, within the multi-quantum well region, all quantum barrier layers comprise any of essentially pure silicon and silicon germanium, all quantum well layers comprise any of silicon germanium and essentially pure germanium, a percentage of silicon in the quantum barrier layers is greater than a percentage of silicon in the quantum well layers, and a percentage of germanium in the quantum barrier layers is less than the percentage of germanium in the quantum well layers, and
    wherein the second doped semiconductor region comprises an N-type epitaxial silicon germanium layer.

7. A photonics structure comprising:
    a semiconductor layer having a first type conductivity;
    a dielectric layer on the semiconductor layer, wherein a trench extends through the dielectric layer to the semiconductor layer;

a modulator comprising:
- a first doped semiconductor region having the first type conductivity, wherein the first doped semiconductor region is at a bottom of the trench;
- a multi-quantum well region in the trench on the first doped semiconductor region, wherein the trench has first sidewalls and the multi-quantum well region has second sidewalls adjacent to the first sidewalls, respectively, wherein a width of the multi-quantum well region narrows toward a top of the trench, wherein at least upper segments of the second sidewalls of the multi-quantum well region are physically separated from the first sidewalls of the trench by spaces that widen toward the top of the trench;
- dielectric spacers filling the spaces between the first sidewalls of the trench and the second sidewalls of the multi-quantum well region, wherein widths of the dielectric spacers increase toward the top of the trench; and
- a second doped semiconductor region on the multi-quantum well region, wherein the second doped semiconductor region has a second type conductivity that is different from the first type conductivity; and waveguides adjacent to opposing ends of the modulator.

8. The photonics structure of claim 7,
wherein top surfaces of the dielectric spacers are essentially co-planar with top surfaces of the dielectric layer and the multi-quantum well region, and
wherein the modulator further comprises top contacts on outer edge portions of the second doped semiconductor region.

9. The photonics structure of claim 7,
wherein top surfaces of the dielectric spacers are below a level of a top surface of the dielectric layer and below a level of a top surface of the multi-quantum well region,
wherein the second doped semiconductor region extends laterally across the top surfaces of the dielectric spacers to the first sidewalls of the trench, and
wherein the modulator further comprises top contacts on outer edge portions of the second doped semiconductor region aligned above the dielectric spacers.

10. The photonics structure of claim 7, wherein the dielectric layer and the dielectric spacers comprise a same dielectric material.

11. The photonics structure of claim 7, wherein the dielectric layer and the dielectric spacers comprise different dielectric materials.

12. The photonics structure of claim 7,
wherein the semiconductor layer comprises P-type silicon layer,
wherein the first doped semiconductor region comprises a P-type epitaxial silicon germanium layer,
wherein the multi-quantum well region comprises a stack of intrinsic epitaxial semiconductor layers comprising:
- a bottom quantum barrier layer;
- alternating quantum well and quantum barrier layers with a lowermost quantum well layer being above and immediately adjacent to the bottom quantum barrier layer; and
- a top quantum barrier layer above and immediately adjacent to an uppermost quantum well layer, wherein, within the multi-quantum well region, all quantum barrier layers comprise any of essentially pure silicon and silicon germanium, and all quantum well layers comprise any of silicon germanium and essentially pure germanium, a percentage of silicon in the quantum barrier layers is greater than a percentage of silicon in the quantum well layers, and a percentage of germanium in the quantum barrier layers is less than the percentage of germanium in the quantum well layers, and
wherein the second doped semiconductor region comprises an N-type epitaxial silicon germanium layer.

13. A method comprising:
forming a modulator, wherein the forming of the modulator comprises:
- forming a first doped semiconductor region at a bottom of a trench that extends through a dielectric layer to a semiconductor layer, wherein the first doped semiconductor region has a first type conductivity;
- forming a multi-quantum well region in the trench on the first doped semiconductor region, wherein the trench has first sidewalls and the multi-quantum well region has second sidewalls adjacent to the first sidewalls, respectively, and wherein the multi-quantum well region is formed such that a width of the multi-quantum well region narrows toward a top of the trench such that at least upper segments of the second sidewalls of the multi-quantum well region are physically separated from the first sidewalls of the trench by spaces that widen toward the top of the trench;
- forming dielectric spacers filling the spaces between the second sidewalls of the multi-quantum well region and the first sidewalls of the trench, wherein widths of the spacers increase toward the top of the trench; and
- forming a second doped semiconductor region on the multi-quantum well region, wherein the second doped semiconductor region has a second type conductivity that is different from the first type conductivity.

14. The method of claim 13, wherein the forming of the modulator further comprises:
epitaxially growing a first in-situ doped semiconductor layer for the first doped semiconductor region in the trench on the semiconductor layer;
epitaxially growing a stack of intrinsic semiconductor layers for the multi-quantum well region on the first doped semiconductor region, the stack comprising:
- a bottom quantum barrier layer;
- alternating quantum well and quantum barrier layers with a lowermost quantum well layer being above and immediately adjacent to the bottom quantum barrier layer; and
- a top quantum barrier layer above and immediately adjacent to an uppermost quantum well layer, wherein the epitaxially growing of the stack results in at least upper segments of the second sidewalls of the multi-quantum well region being angled away from the first sidewalls;

depositing a dielectric spacer layer to fill the spaces between the second sidewalls of the multi-quantum well region and the first sidewalls of the trench;
performing a planarization process to expose the top quantum barrier layer and form the dielectric spacers in the spaces; and
epitaxially growing a second in-situ doped semiconductor layer for the second doped semiconductor region on the top quantum barrier layer.

15. The method of claim 14, further comprising, before the epitaxially growing of the second in-situ doped semiconductor layer, recessing the dielectric spacers, wherein the second in-situ doped semiconductor layer is epitaxially grown so that the second doped semiconductor region covers the top quantum barrier layer and extends laterally across top surfaces of the dielectric spacers to the first sidewalls of the trench.

16. The method of claim 14,
wherein the semiconductor layer comprises a P-type silicon layer,
wherein the first in-situ doped semiconductor layer for the first doped semiconductor region comprises a P-type epitaxial silicon germanium layer,
wherein the stack of intrinsic epitaxial semiconductor layers for the multi-quantum well region comprises:
a bottom quantum barrier layer;
alternating quantum well and quantum barrier layers with a lowermost quantum well layer being above and immediately adjacent to the bottom quantum barrier layer; and
a top quantum barrier layer above and immediately adjacent to an uppermost quantum well layer,
wherein, within the multi-quantum well region, all quantum barrier layers comprise any of essentially pure silicon and silicon germanium, all quantum well layers comprise any of silicon germanium and essentially pure germanium, a percentage of silicon in the quantum barrier layers is greater than a percentage of silicon in the quantum well layers, and a percentage of germanium in the quantum barrier layers is less than the percentage of germanium in the quantum well layers, and
wherein the second in-situ doped semiconductor layer for the second doped semiconductor region comprises an N-type epitaxial silicon germanium layer.

17. The method of claim 13, further comprising: forming top contacts on outer edge portions of the second doped semiconductor region.

18. The method of claim 13, wherein the dielectric layer and the dielectric spacers comprise a same dielectric material.

19. The method of claim 13, wherein the dielectric layer and the dielectric spacers comprise different dielectric materials.

20. The method of claim 13, further comprising: forming waveguides, wherein the modulator and the waveguides are formed such that the modulator is at an interface between the waveguides.

* * * * *